(12) United States Patent
Lantzer et al.

(10) Patent No.: US 8,497,153 B2
(45) Date of Patent: Jul. 30, 2013

(54) INTEGRATED BACK-SHEET FOR BACK CONTACT PHOTOVOLTAIC MODULE

(71) Applicant: E I Du Pont De Nemours and Company, Wilmington, DE (US)

(72) Inventors: Thomas D. Lantzer, Wake Forest, NC (US); Dilip Natarajan, Wilmington, DE (US); Steven Alcus Threefoot, Arden, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/661,277

(22) Filed: Oct. 26, 2012

(65) Prior Publication Data

US 2013/0109125 A1    May 2, 2013

Related U.S. Application Data

(60) Provisional application No. 61/553,588, filed on Oct. 31, 2011.

(51) Int. Cl.
*H01L 21/00* (2006.01)
*H01L 31/042* (2006.01)

(52) U.S. Cl.
USPC ............ 438/66; 438/80; 438/98; 136/244; 136/251; 257/E21.158

(58) Field of Classification Search
USPC ............ 438/66, 98, 80; 136/244, 245, 251; 136/256; 257/E21.158
See application file for complete search history.

(56) References Cited

U.S. PATENT DOCUMENTS

| | | | |
|---|---|---|---|
| 5,425,832 A | 6/1995 | Kusano et al. | |
| 5,892,558 A | 4/1999 | Ge et al. | |
| 5,972,732 A * | 10/1999 | Gee et al. | 136/256 |
| 6,538,084 B2 | 3/2003 | Kitahara et al. | |
| 7,153,722 B2 | 12/2006 | Shimizu | |
| 7,432,438 B2 | 10/2008 | Rubin et al. | |
| 8,133,752 B2 * | 3/2012 | Hayes | 438/64 |
| 2007/0289768 A1 | 12/2007 | Moore et al. | |
| 2008/0314626 A1 | 12/2008 | Moore | |
| 2009/0032087 A1 * | 2/2009 | Kalejs | 136/246 |
| 2010/0200058 A1 | 8/2010 | Funakoshi | |
| 2011/0067751 A1 | 3/2011 | Meakin et al. | |
| 2011/0083716 A1 * | 4/2011 | Meakin et al. | 136/244 |

(Continued)

FOREIGN PATENT DOCUMENTS

| | | |
|---|---|---|
| EP | 1781735 B1 | 12/2008 |
| WO | 2006122376 A1 | 11/2006 |

(Continued)

OTHER PUBLICATIONS

Rees, Richard W., Ionic Bonding in Thermoplastic Resins, DuPont Innovation, 1971, pp. 1-4, vol. 2(2).

(Continued)

*Primary Examiner* — Michael Trinh

(57) ABSTRACT

A process for making a back-contact solar cell module is provided. Electrically conductive wires of an integrated back-sheet are physically and electrically attached to the back contacts of the solar cells of a solar cell array through openings in a polymeric interlayer dielectric layer using an electrically conductive binder before thermal lamination of the module.

20 Claims, 17 Drawing Sheets

U.S. PATENT DOCUMENTS

| | | | |
|---|---|---|---|
| 2011/0083726 A1 | 4/2011 | Takayanagi et al. | |
| 2011/0300664 A1* | 12/2011 | Chung | 438/80 |
| 2012/0285501 A1* | 11/2012 | Zhao et al. | 136/244 |
| 2013/0056758 A1* | 3/2013 | Ziltener et al. | 257/88 |

FOREIGN PATENT DOCUMENTS

| | | |
|---|---|---|
| WO | 2009144715 A2 | 12/2009 |
| WO | 2010027265 A2 | 3/2010 |
| WO | 2011011091 A2 | 1/2011 |
| WO | 2011011855 A1 | 2/2011 |
| WO | 2011044417 A2 | 4/2011 |

OTHER PUBLICATIONS

Rees, Richard W., Physical Properties and Structural Features of Surlyn Ionomer Resins, Polyelectrolyes, 1976, pp. 177-197.

Rappa Review Reports, Daikin's New FluoroResin Ensures Direct Bonding to Metals, Plastics, Japan Chemical Week, Apr. 10, 2003, pp. 2, vol. 44, No. 2216.

U.S. Appl. No. 13/661,161, filed Oct. 26, 2012.
U.S. Appl. No. 13/661,249, filed Oct. 26, 2012.
U.S. Appl. No. 13/661,319, filed Oct. 26, 2012.
U.S. Appl. No. 13/285,233, filed Oct. 31, 2011.

* cited by examiner

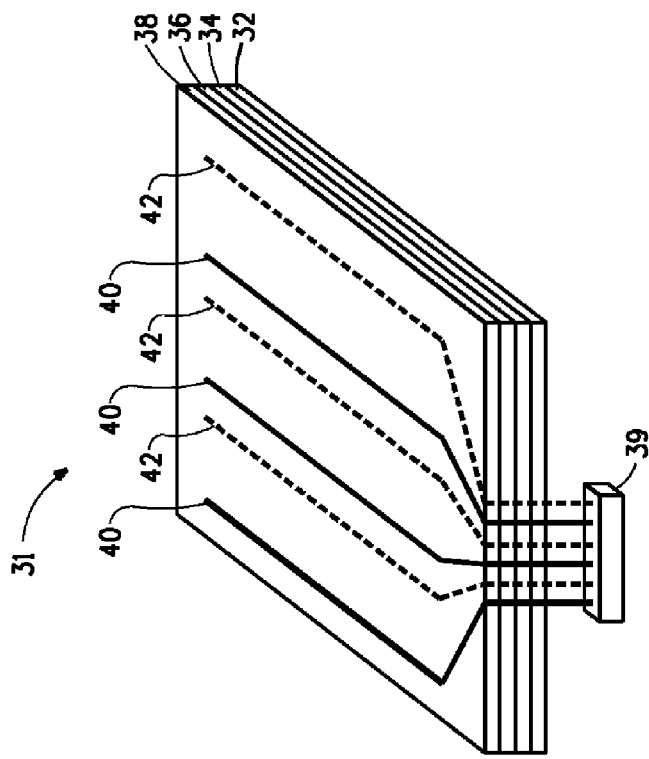
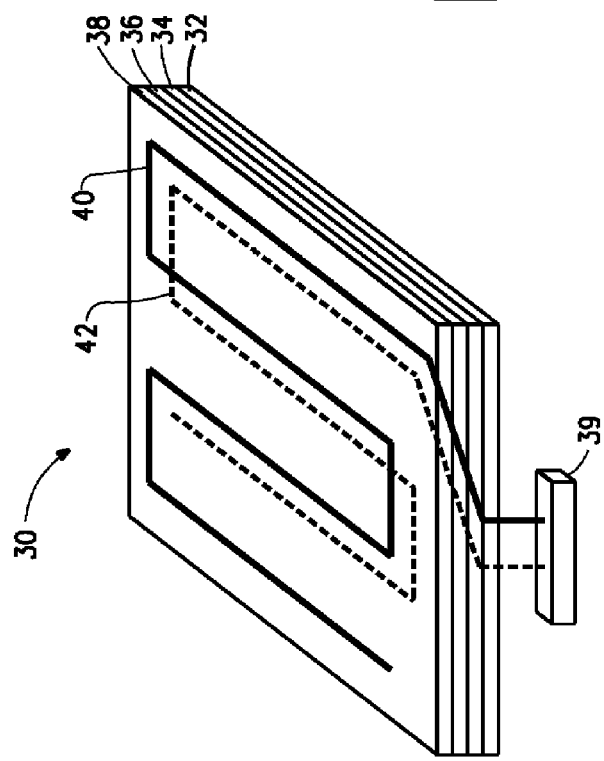

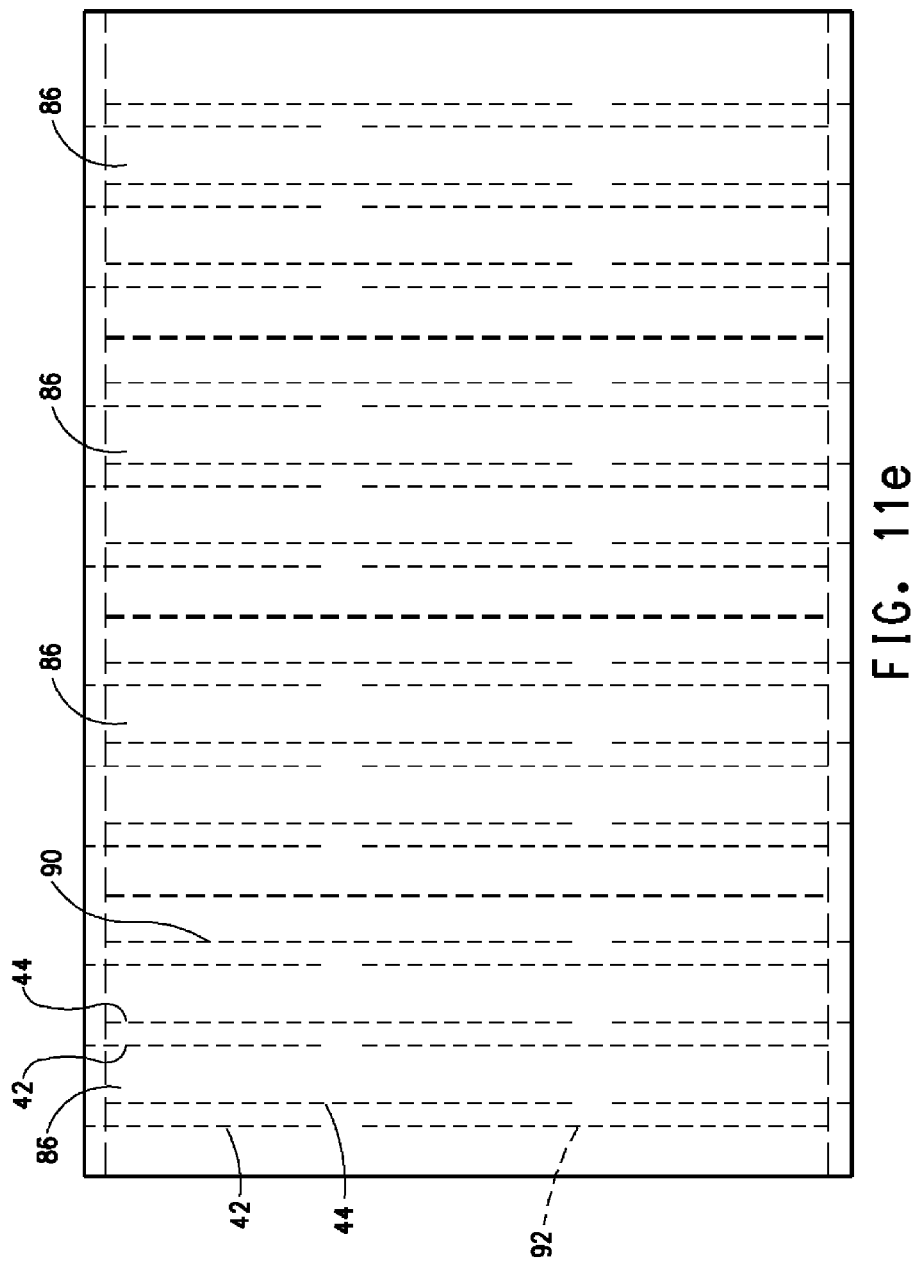

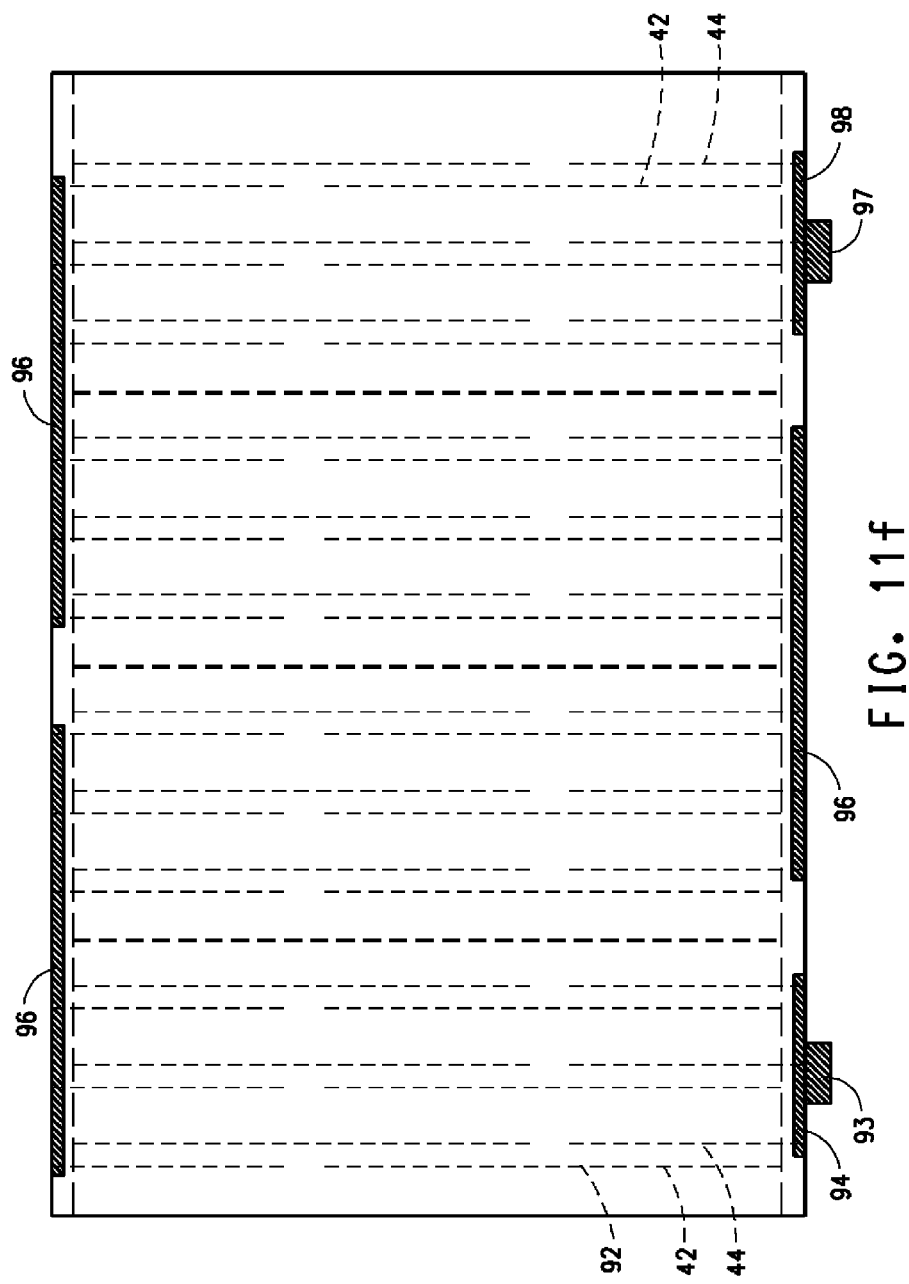

INTEGRATED BACK-SHEET FOR BACK CONTACT PHOTOVOLTAIC MODULE

FIELD OF THE INVENTION

The present invention relates to back-sheets and encapsulant layers for photovoltaic cells and modules, and more particularly to processes for making back-sheets with integrated electrically conductive circuits, and to processes for making back-contact photovoltaic modules with electrically conductive circuits integrated into the back of the modules.

BACKGROUND OF THE INVENTION

A photovoltaic cell converts radiant energy, such as sunlight, into electrical energy. In practice, multiple photovoltaic cells are electrically connected together in series or in parallel and are protected within a photovoltaic module or solar module.

As shown in FIG. 1, a photovoltaic module 10 comprises a light-transmitting substrate 12 or front sheet, a front encapsulant layer 14, an active photovoltaic cell layer 16, a rear encapsulant layer 18 and a back-sheet 20. The light-transmitting substrate is typically glass or a durable light-transmitting polymer film. The transparent front sheet (also know as the incident layer) comprises one or more light-transmitting sheets or film layers. The light-transmitting front sheet may be comprised of glass or plastic sheets, such as, polycarbonate, acrylics, polyacrylate, cyclic polyolefins, such as ethylene norbornene polymers, polystyrene, polyamides, polyesters, silicon polymers and copolymers, fluoropolymers and the like, and combinations thereof. The front and back encapsulant layers 14 and 18 adhere the photovoltaic cell layer 16 to the front and back sheets, they seal and protect the photovoltaic cells from moisture and air, and they protect the photovoltaic cells against physical damage. The encapsulant layers 14 and 18 are typically comprised of a thermoplastic or thermosetting resin such as ethylene-vinyl acetate copolymer (EVA). The photovoltaic cell layer 16 is made up of any type of photovoltaic cell that converts sunlight to electric current such as single crystal silicon solar cells, polycrystalline silicon solar cells, microcrystal silicon solar cells, amorphous silicon-based solar cells, copper indium (gallium) diselenide solar cells, cadmium telluride solar cells, compound semiconductor solar cells, dye sensitized solar cells, and the like. The back-sheet 20 provides structural support for the module 10, it electrically insulates the module, and it helps to protect the module wiring and other components against the elements, including heat, water vapor, oxygen and UV radiation. The module layers need to remain intact and adhered for the service life of the photovoltaic module, which may extend for multiple decades.

Photovoltaic cells typically have electrical contacts on both the front and back sides of the photovoltaic cells. However, contacts on the front sunlight receiving side of the photovoltaic cells can cause up to a 10% shading loss.

In back-contact photovoltaic cells, all of the electrical contacts are moved to the back side of the photovoltaic cell. With both the positive and negative polarity electrical contacts on the back side of the photovoltaic cells, electrical circuitry is needed to provide electrical connections to the positive and negative polarity electrical contacts on the back of the photovoltaic cells. U.S. Patent Application No. 2011/0067751 discloses a back contact photovoltaic module with a back-sheet having patterned electrical circuitry that connects to the back contacts on the photovoltaic cells during lamination of the solar module. The circuitry is formed from a metal foil that is adhesively bonded to a carrier material such as polyester film or Kapton® film. The carrier material may be adhesively bonded to a protective layer such as a Tedlar® fluoropolymer film. The foil is patterned using etching resists that are patterned on the foil by photolithography or by screen printing according to techniques used in the flexible circuitry industry. The back contacts on the photovoltaic cells are adhered to and electrically connected to the foil circuits by adhesive conductive paste. Adhesively bonding metal foil to a carrier material, patterning the metal foil using etching resists that are patterned by photolithography or screen printing, and adhering the carrier material to one or more protective back-sheet layers can be expensive and time consuming.

PCT Publication No. WO2011/011091 discloses a back-contact solar module with a back-sheet with a patterned adhesive layer with a plurality of patterned conducting ribbons placed thereon to interconnect the solar cells of the module. Placing and connecting multiple conducting ribbons between solar cells is time consuming and difficult to do consistently.

There is a need for a more efficient process for producing a back-contact photovoltaic module with integrated conductive circuitry for a back contact photovoltaic cell and for producing back-contact solar cell modules.

SUMMARY

A process for making a back-contact solar cell module is provided. The module has a solar cell array of the module has at least four solar cells each having a front light receiving surface, an active layer that generates an electric current when said front light receiving surface is exposed to light, and a rear surface opposite said front surface with positive and negative polarity electrical contacts thereon. At least two of the solar cells of the solar cell array are arranged in a column.

A polymeric interlayer dielectric layer has opposite first and second sides and openings arranged in a plurality of columns extending in the lengthwise direction of the polymeric interlayer dielectric layer. The first side of said polymeric interlayer dielectric layer is placed on the rear surfaces of the solar cells of the solar cell array, with the holes in the polymeric interlayer dielectric layer aligned over electrical contacts on the rear surface of the solar cells.

A polymeric wire mounting layer is provided that has opposite first and second sides. Elongated electrically conductive wires are adhered to the first side of said polymeric wire mounting layer with the electrically conductive wires substantially aligned with the lengthwise direction of said polymeric wire mounting layer. The electrically conductive wires each having a cross sectional area of at least 70 square mils along their length, they do not touch each other upon being adhered to said polymeric wire mounting layer, and they extend at least the length of a column of the solar cells in the solar cell array. The first side of the wire mounting layer is placed on the polymeric interlayer dielectric layer wherein the conductive wires on the first side of the wire mounting layer are over the openings in one of the plurality of columns of openings in said polymeric interlayer dielectric layer.

An electrically conductive binder is provided in the holes of the polymeric interlayer dielectric layer, and is heated such that the binder physically and electrically attaches the electrically conductive wires to the positive and negative electrical contacts on said solar cells through the openings in said polymeric interlayer dielectric layer. A polymeric back-sheet is placed over the second side of said polymeric wire mounting layer. The polymeric back-sheet, polymeric wire mounting layer, polymeric interlayer dielectric layer, and solar cell array are thermally laminated after the conductive wires have been physically and electrically attached to the positive and negative electrical contacts on the rear surface of the solar cells by the binder.

BRIEF DESCRIPTION OF THE DRAWINGS

The detailed description will refer to the following drawings which are not drawn to scale and wherein like numerals refer to like elements:

FIGS. 3a and 3b are schematic representations of back-sheets with integrated wire circuits.

FIGS. 11a-11f illustrate steps of a process for forming a back-contact solar cell module in which an array of back-contact solar cells are electrically connected in series by conductive wires that are integrated into the back encapsulant and back-sheet of the solar cell module.

DETAILED DESCRIPTION OF THE INVENTION

Figure 1:
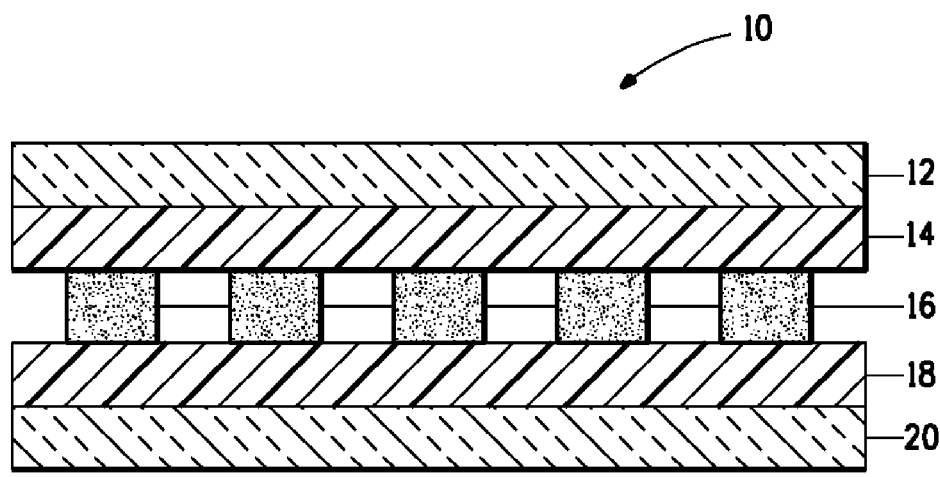
FIG. 1 is cross-sectional view of a conventional solar cell module.

To the extent permitted by the United States law, all publications, patent applications, patents, and other references mentioned herein are incorporated by reference in their entirety.

The materials, methods, and examples herein are illustrative only and the scope of the present invention should be judged only by the claims.

DEFINITIONS

The following definitions are used herein to further define and describe the disclosure.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

As used herein, the terms "a" and "an" include the concepts of "at least one" and "one or more than one".

Unless stated otherwise, all percentages, parts, ratios, etc., are by weight.

When the term "about" is used in describing a value or an end-point of a range, the disclosure should be understood to include the specific value or end-point referred to.

As used herein, the terms "sheet", "layer" and "film" are used in their broad sense interchangeably. A "frontsheet" is a sheet, layer or film on the side of a photovoltaic module that faces a light source and may also be described as an incident layer. Because of its location, it is generally desirable that the frontsheet has high transparency to the incident light. A "back-sheet" is a sheet, layer or film on the side of a photovoltaic module that faces away from a light source, and is generally opaque. In some instances, it may be desirable to receive light from both sides of a device (e.g., a bifacial device), in which case a module may have transparent layers on both sides of the device.

"Encapsulant" layers are used to encase the fragile voltage-generating photoactive layer so as to protect it from environmental or physical damage and hold it in place in the photovoltaic module. Encapsulant layers may be positioned between the solar cell layer and the incident layer, between the solar cell layer and the backing layer, or both. Suitable polymer materials for these encapsulant layers typically possess a combination of characteristics such as high transparency, high impact resistance, high penetration resistance, high moisture resistance, good ultraviolet (UV) light resistance, good long term thermal stability, adequate adhesion strength to frontsheets, back-sheets, other rigid polymeric sheets and cell surfaces, and good long term weatherability.

As used herein, the terms "photoactive" and "photovoltaic" may be used interchangeably and refer to the property of converting radiant energy (e.g., light) into electric energy.

As used herein, the terms "photovoltaic cell" or "photoactive cell" or "solar cell" mean an electronic device that converts radiant energy (e.g., light) into an electrical signal. A photovoltaic cell includes a photoactive material layer that may be an organic or inorganic semiconductor material that is capable of absorbing radiant energy and converting it into electrical energy. The terms "photovoltaic cell" or "photoactive cell" or "solar cell" are used herein to include photovoltaic cells with any types of photoactive layers including, crystalline silicon, polycrystalline silicon, microcrystal silicon, and amorphous silicon-based solar cells, copper indium (gallium) diselenide solar cells, cadmium telluride solar cells, compound semiconductor solar cells, dye sensitized solar cells, and the like.

As used herein, the term "photovoltaic module" or "solar module" (also "module" for short) means an electronic device having at least one photovoltaic cell protected on one side by a light transmitting front sheet and protected on the opposite side by an electrically insulating protective back-sheet.

Disclosed herein are integrated back-sheets for back-contact solar cell modules and processes for forming such integrated back-sheets. Also disclosed are back-contact solar modules with an integrated conductive wire circuitry and processes for forming such back-contact solar modules with an integrated circuitry.

Figure 2B:
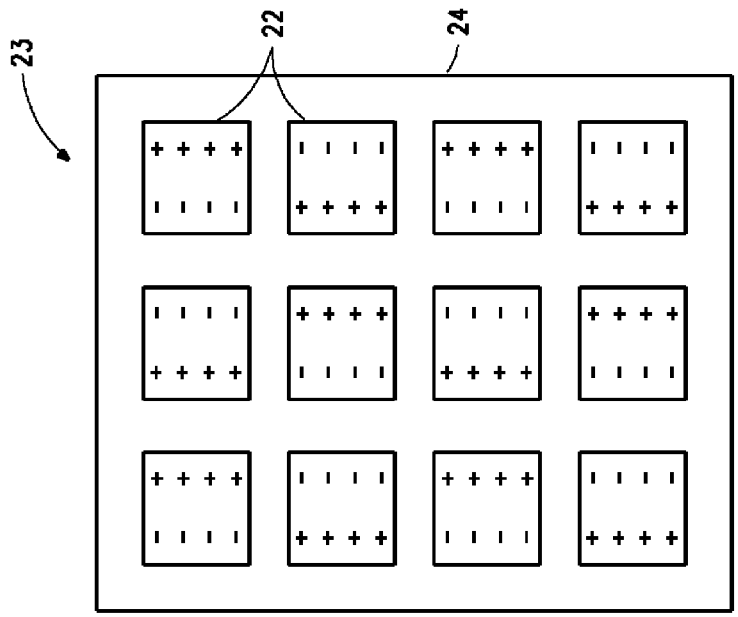
FIGS. 2a and 2b are schematic plan views of the back side of arrays of back-contact solar cells.
Figure 2A:
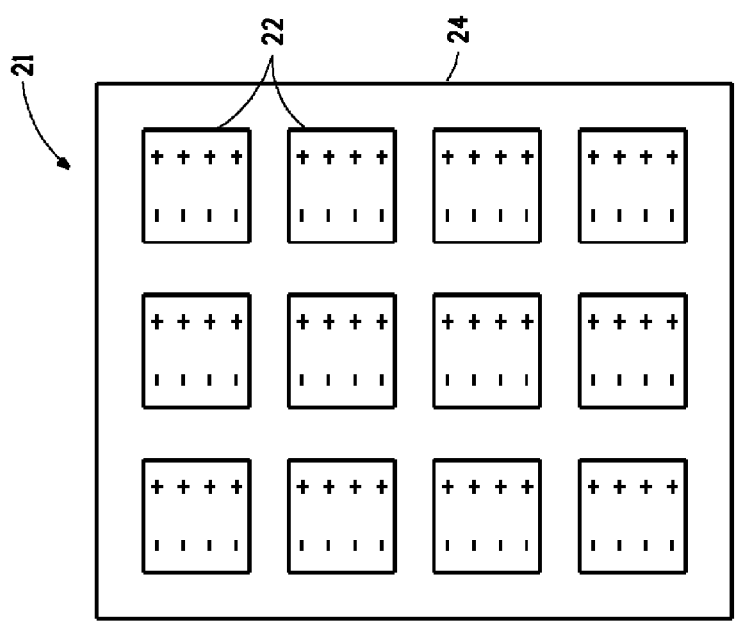

Arrays of back-contact solar cells are shown in FIGS. 2a and 2b. The disclosed integrated back-sheet is useful for protecting and electrically connecting back-contact solar cell arrays like those shown in FIGS. 2a and 2b as well as with arrays of other types of back-contact solar cells. The solar cell array 21 includes multiple solar cells 22, such as single crystal silicon solar cells. The front side (not shown) of each solar cell 22 is adhered to an encapsulant layer 24 that is or will be preferably adhered to a transparent front sheet (not shown) of the solar module. Solar modules with an array of twelve solar cells 22 are shown in FIGS. 2a and 2b, but the disclosed integrated back-sheet is useful as a back-sheet for back-contact solar modules having solar cell arrays of anywhere from four to more than 100 solar cells.

Each of the solar cells 22 has multiple positive and negative polarity contacts on back side of the solar cell. The contacts on the back side of the solar cells are typically made of a metal to which electric contacts can be readily formed, such as silver or platinum contact pads. The contacts are typically formed from a conductive paste comprising an organic medium, glass frit and silver particles, and optionally inorganic additives, which is fired at high temperature to form metal contact pads. The solar cells shown in FIGS. 2a and 2b each have a column of four negative contacts and a column of four positive contacts, but it is contemplated that the solar cells could have multiple columns of negative and positive contacts and that each column could have anywhere form two to more than twenty contacts. In the solar cell array shown in FIG. 2a, the contacts of each cell are arranged in the same way. The arrangement shown in FIG. 2a is used with the disclosed integrated back-sheet when the back-sheet is used to connect the cells in parallel. Alternatively, the solar cells in each column of the array can be arranged such that the alternating cells in each column are flipped 180 degrees as shown in FIG. 2b. The solar cell array 23 shown in FIG. 2b is used with the disclosed integrated back-sheet when the back-sheet is used to connect the solar cells in series, as will be described more fully below.

FIG. 3a shows an embodiment of the disclosed integrated back-sheet. The back-sheet 30 shown in FIG. 3a is a laminate made with four layers, but it is contemplated that the back-sheet could be made with fewer or more layers. The back-sheet of FIG. 3a has an outer layer 32 and inner layers 34 and 36. For example, the outer layer 32 is preferably made of a durable, weather resistant and electrically insulating polymeric material. The layer 34 may be an adhesive layer such as an epoxy or polymeric adhesive. The layer 36 can be another polymeric layer utilized for other properties such as tear strength, low elongation or moisture vapor barrier. When incorporated into a photovoltaic module, the outer layer 32 has an exposed surface that may be exposed to the environment.

The back-sheet layers may be comprised of polymeric material, optionally in conjunction with other materials. The polymeric layers may comprise a polymer film, sheet or laminate. The polymeric layers may, for example, be comprised of film comprised of one or more of polyester, fluoropolymer, polycarbonate, polypropylene, polyethylene, cyclic polyloefin, acrylate polymer such as polymethylmethacrylate (PMMA), polystyrene, styrene-acrylate copolymer, acrylonitrile-styrene copolymer, poly(ethylene naphthalate), polyethersulfone, polysulfone, polyamide, epoxy resin, glass fiber reinforced polymer, carbon fiber reinforced polymer, acrylic, cellulose acetate, vinyl chloride, polyvinylidene chloride, vinylidene chloride, and the like. The layers of the back-sheet laminate may be adhered to each other by adhesives between the layers or by adhesives incorporated into one or more of the laminate layers. Laminates of polyester films and fluoropolymer are suitable for the back-sheet layers. Suitable polyesters include polyethylene terephthalate (PET), polytrimethylene terephthalate, polybutylene terephthalate, polyhexamethylene terephthalate, polyethylene phthalate, polytrimethylene phthalate, polybutylene phthalate, polyhexamethylene phthalate or a copolymer or blend of two or more of the above. Suitable fluoropolymers include polyvinylfluoride (PVF), polyvinylidene fluoride, polychlorotrifluoroethylene, polytetrafluoroethylene, ethylene-tetrafluoroethylene and combinations thereof.

Adhesive layers may comprise any conventional adhesives known in the art. Polyurathane, epoxy, and ethylene copolymer adhesives may, for example, be used to adhere the polymer film layers of the back-sheet. There are no specific restrictions to the thickness of the adhesive layer(s) as long as the adhesion strength and durability can meet the back-sheet performance requirements. In one embodiment, the thickness of the adhesive layer is in the range of 1-30 microns, preferably 5-25 microns, and more preferably 8-18 microns. There are no specific restrictions on the thickness of the back-sheet or on the various polymer film layers of the back-sheet. Thickness varies according to specific application. In one preferred embodiment, the polymeric substrate comprises a PVF outer exposed layer with a thickness in the range of 20-50 µm adhered to a PET film with a thickness of 50-300 µm using an extruded ethylene copolymer thermoplastic adhesive.

Various known additives may be added to the polymer layer(s) of the back-sheet to satisfy various different requirements. Suitable additives may include, for example, light stabilizers, UV stabilizers, thermal stabilizers, anti-hydrolytic agents, light reflection agents, pigments, titanium dioxide, dyes, and slip agents.

The polymeric films of the polymeric substrate may include one or more non-polymeric layers or coatings such as a metallic, metal oxide or non-metal oxide surface coating. Such non-polymeric layers or coatings are helpful for reducing moisture vapor transmission through a back-sheet structure. The thickness of a preferred metal oxide layer or non-metal oxide layer on one or more of the polymer films typically measures between 50 Å and 4000 Å, and more typically between 100 Å and 1000 Å.

A wire mounting layer, such as an encapsulant material layer or a polymeric adhesive, is provided on the back-sheet layer 36. The wire mounting layer 38 is preferably an encapsulant material, such as a polymeric adhesive, that can hold the wires 40 and 42 in place and attach them to the other layer(s) of the back-sheet 30. In the embodiment shown in FIG. 3a, the wires 40 are adhered to the surface or partially embedded in the wire mounting layer with a surface of the wires 40 and 42 being exposed. The wire 42 is more deeply embedded in the wire mounting layer at places where the wires 40 and 42 cross paths. When the solar cells are connected in parallel, the wire 40 is connected to the solar cell back contacts of one polarity and the wire 42 is connected to the solar cell back contacts of the opposite polarity. The wires 40 and 42 may be embedded under the surface of the wire mounting layer 38 in which case the wire mounting layer 38 will have holes formed in it at points where the wires 40 and 42 make electrical contact with solar cell back contacts. Such holes may be formed, for example, by stamping or die cutting.

An alternative embodiment of the disclosed integrated back-sheet is shown in FIG. 3b. In the integrated back-sheet 31, multiple wires are adhered or partially embedded in the wire mounting layer 38 in a generally parallel arrangement. Where the integrated back-sheet is used to connect like mounted solar cells like those shown in FIG. 2a, each set of wires 40 and 42 connect to negative and positive contacts, respectively, of a column of solar cell contacts so as to electrically connect the column of cells in parallel. Were the integrated back-sheet is used to connect solar cells in series, every other cell in a column of cells can be rotated 180 degrees as shown in FIG. 2b and the wires 40 and 42 can be selectively cut to connect adjacent cells in series in a column of solar cells as more fully described below.

The wire mounting layer 38 preferably comprises an encapsulant material such as a thermoplastic or thermoset material. The wire mounting layer 38 preferably has a thickness sufficient to be self supporting and sufficient to support wires mounted on the wire mounting layer. For example, the wire mounting layer typically has a thickness in the range of 1 mils to 25 mils, and more preferably in the range of 4 mils to 18 mils. The wire mounting layer can include more than one layer of polymer material, wherein each layer may include the same material or a material different from the other layer(s). The wire mounting layer may be comprised of polymer with adhesive properties, or an adhesive coating can be applied to the surface(s) of the wire mounting layer.

Polymeric materials useful in the wire mounting layer 38 may include ethylene methacrylic acid and ethylene acrylic acid, ionomers derived therefrom, or combinations thereof. Such wire mounting layers may also be films or sheets comprising poly(vinyl butyral)(PVB), ionomers, ethylene vinyl acetate (EVA), poly(vinyl acetal), polyurethane (PU), polyolefins such as linear low density polyethylene, polyolefin block elastomers, ethylene acrylate ester copolymers, such as poly(ethylene-co-methyl acrylate) and poly(ethylene-co-butyl acrylate), silicone elastomers and epoxy resins. As used herein, the term "ionomer" means and denotes a thermoplastic resin containing both covalent and ionic bonds derived from ethylene/acrylic or methacrylic acid copolymers. In some embodiments, monomers formed by partial neutralization of ethylene-methacrylic acid copolymers or ethylene-acrylic acid copolymers with inorganic bases having cations of elements from Groups I, II, or III of the Periodic table, notably, sodium, zinc, aluminum, lithium, magnesium, and barium may be used. The term ionomer and the resins identified thereby are well known in the art, as evidenced by Richard W. Rees, "Ionic Bonding In Thermoplastic Resins", DuPont Innovation, 1971, 2(2), pp. 1-4, and Richard W. Rees, "Physical 30 Properties And Structural Features Of Surlyn Ionomer Resins", Polyelectrolytes, 1976, C, 177-197. Other suitable ionomers are further described in European patent EP1781735, which is herein incorporated by reference.

Preferred ethylene copolymers for use in the wire mounting layer are more fully disclosed in PCT Patent Publication No. WO2011/044417 which is hereby incorporated by reference. Such ethylene copolymers are comprised of ethylene and one or more monomers selected from the group consisting of C1-4 alkyl acrylates, C1-4 alkyl methacrylates, methacrylic acid, acrylic acid, glycidyl methacrylate, maleic anhydride and copolymerized units of ethylene and a comonomer selected from the group consisting of C4-C8 unsaturated anhydrides, monoesters of C4-C8 unsaturated acids having at least two carboxylic acid groups, diesters of C4-C8 unsaturated acids having at least two carboxylic acid groups and mixtures of such copolymers, wherein the ethylene content in the ethylene copolymer preferably accounts for 60-90% by weight. A preferred ethylene copolymer adhesive layer includes a copolymer of ethylene and another a-olefin. The ethylene content in the copolymer accounts for 60-90% by weight, preferably accounting for 65-88% by weight, and ideally accounting for 70-85% by weight of the ethylene copolymer. The other comonomer(s) preferably constitute 10-40% by weight, preferably accounting for 12-35% by weight, and ideally accounting for 15-30% by weight of the ethylene copolymer. The ethylene copolymer wire mounting layer is preferably comprised of at least 70 weight percent of the ethylene copolymer. The ethylene copolymer may be blended with up to 30% by weight, based on the weight of the wire mounting layer, of other thermoplastic polymers such as polyolefins, as for example linear low density polyethylene, in order to obtain desired properties. Ethylene copolymers are commercially available, and may, for example, be obtained from DuPont under the trade-name Bynel®.

The wire mounting layer may further contain any additive or filler known within the art. Such exemplary additives include, but are not limited to, plasticizers, processing aides, flow enhancing additives, lubricants, pigments, titanium dioxide, calcium carbonate, dyes, flame retardants, impact modifiers, nucleating agents to increase crystallinity, anti-blocking agents such as silica, thermal stabilizers, hindered amine light stabilizers (HALS), UV absorbers, UV stabilizers, anti-hydrolytic agents, dispersants, surfactants, chelating agents, coupling agents, adhesives, primers, reinforcement additives, such as glass fiber, and the like. There are no specific restrictions to the content of the additives and fillers in the wire mounting layer as long as the additives do not produce an adverse impact on the adhesion properties or stability of the layer.

Figure 4B:
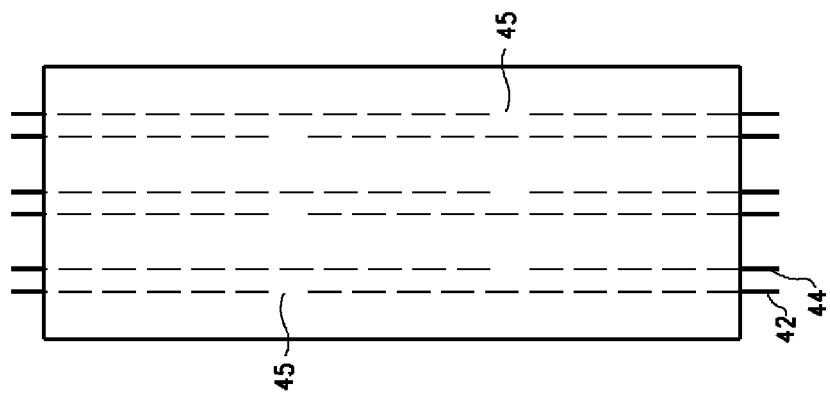
FIG. 4b is a plan view of the opposite side of the wire mounting layer after the conductive wires have been selectively cut.
Figure 4A:
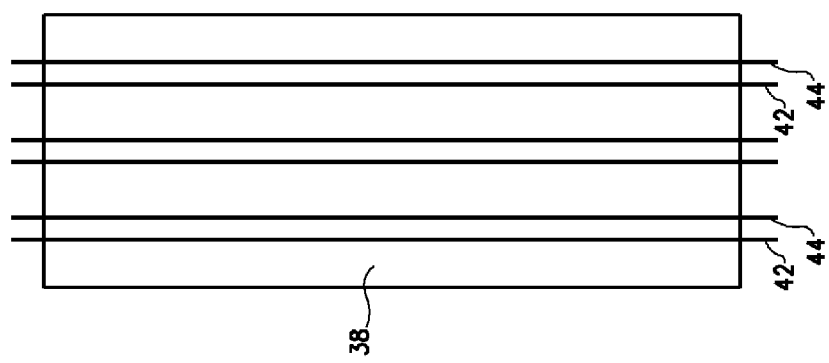
FIG. 4a is a plan view of a wire mounting layer with adhered conductive wires.

A polymeric wire mounting layer 38 is shown in FIG. 4a. Substantially parallel pairs of electrically conductive wires 42 and 44 are shown on the wire mounting layer. Three pairs of wires 42 and 44 are shown in FIG. 4a, but it is contemplated that more or fewer pairs of wires could be used depending upon the number of columns of solar cells in the solar cell array to which the integrated back-sheet is applied, and depending on the number of columns of back contacts on each of the solar cells. It is also contemplated that the spacing of the wires and the wire pairs will depend upon the spacing of the columns of solar cells in the array to which the integrated back-sheet is applied, and on the arrangement and spacing of the columns of back contacts on each of the solar cells. The wire mounting layer is in the form of an elongated strip that covers at least one column of solar cells in the solar cell array, and preferably covers multiple columns of solar cells in the solar cell array, or may cover all of the columns of solar cells in the solar cell array.

The wires 42 and 44 are preferably conductive metal wires. The metal wires are preferably comprised of metal selected from copper, nickel, tin, silver, aluminum, indium, lead, and combinations thereof. In one embodiment, the metal wires are coated with tin, nickel or a solder and/or flux material. Where the wires are coated with a solder and optionally with a flux, the wires can more easily be welded to the back contacts of the solar cells as discussed in greater detail below. For example, aluminum wires may be coated with an aluminum/silver alloy that can be easily soldered using conventional methods. Where the wires are coated with solder, such as an alloy, the solder may be coated on the wires along their full length or only on the portions of the wires that will come into contact with the solar cell back contacts in order to reduce the amount of the coating material used. The conductive wires may be coated with an electrically insulating material such as a plastic sheath so as to help prevent short circuits in the solar cells when the wires are positioned over the back of an array of solar cells. Were the conductive wires are coated with an insulating material, the insulating material can be formed with breaks where the wires are exposed to facilitate the electrical connection of the wires to the back contacts of the solar cells. Alternatively, the insulating material may be selected such that it will melt or burn off when the wires are soldered or welded to the back contacts on the solar cells. The electrically conductive wires each have a cross sectional area of at least 70 square mils along their length, and more preferably have a cross sectional area of at least 200 square mils along their length, and more preferably have a cross sectional area of 500 to 1200 square mils along their length. This wire cross section provides the strength, current carrying ability, low bulk resistivity, and wire handling properties desired for module efficiency and manufacturability. The electrically conductive wires may have any cross sectional shape, but ribbon shaped wires having a width and thickness where the wire width is at least three times greater than the wire thickness, and more preferably where the wire width is 3 to 15 times the wire thickness, have been found to be especially well suited for use in the integrated back-sheet because wider wires make it easier to align the wires with the back contacts of the solar cells when the integrated back-sheet is formed and applied to an array of back-contact solar cells.

The wire mounting layer 38 should be long enough to cover multiple solar cells, and is preferably long enough to cover all of the solar cells in a column of solar cells in the solar cell array to which the integrated back-sheet is applied, and may even be long enough to cover columns of solar cells in multiple solar cell arrays, as for example where the wires are applied to a long strip of the wire mounting layer in a continuous roll-to-roll process. Typical crystalline silicon solar cells have a size of about 12 to 15 cm by 12 to 15 cm, and when incorporated into a module are spaced about 0.2 to 0.6 cm from each other. Modules as large as 1 to two square meters are known. Thus, the wires and wire mounting layer have a typical length of at least 24 cm, and more preferably at least 50 cm, and they may be as long as 180 cm for a module of such length.

The wire mounting layer and the electrically conductive wires can be continuously fed into a heated nip where the wires are brought into contact with and adhered to the wire mounting layer by heating the wire mounting layer at the nip so as to make it tacky. Alternatively, the wire mounting layer can be extruded with the wires fed into the wire mounting layer during the extrusion process. In another embodiment, the wires and the wire mounting layer can be heated and pressed in a batch lamination press to partially or fully embed the wires into the wire mounting layer. Pressure may be applied to the wires at the heated nip so as to partially or fully embed the conductive wires in the wire mounting layer. Preferably a surface of the wires remains exposed on the surface of the wire mounting layer after the wire is partially or fully embedded in the wire mounting material so that it will still be possible to electrically connect the wires to the back contacts of an array of back-solar cells.

Where the solar cells of the array will be connected in parallel, the full length wires can be used as shown in FIG. 4a and subsequently connected to a column of solar cells like one of the solar cell columns shown in FIG. 2a. Where the solar cells of the array will be connected in series, the wires are cut at selected points 45 as shown in FIG. 4b and connected to a column of solar cells where alternating cells have been flipped by 180 degrees, like one of the columns of solar cells shown in FIG. 2b, and as more fully described below. Cutting the wires can be performed by a variety of methods including mechanical die cutting, rotary die cutting, mechanical drilling, or laser ablation. The wires or the wires along with the underlying wire mounting layer may also be punched out at selected locations.

In order to prevent electrical shorting of the solar cells, it may be necessary to apply an electrically insulating dielectric material between the conductive wires and the back of the solar cells of the back-contact solar cell array. This dielectric layer is provided to maintain a sufficient electrical separation between the conductive wires and the back of the solar cells. The dielectric layer, known as an interlayer dielectric (ILD), may be applied as a sheet over all of the wires and the wire mounting layer, or as strips of dielectic material over just the electrically conductive wires. It is necessary to form openings in the ILD as for example by die cutting or punching sections of the ILD, that will be aligned over the back contacts and through which the back contacts will be electrically connected to the conductive wires. Alternatively, the ILD maybe applied by screen printing. The printing can be on the cells or on the wire mounting layer and wires, and can cover the entire area between the wire mounting layer and the solar cell array or just selected areas where the wires are present. Where the ILD is printed, it may be printed only in the areas where the wires need to be prevented from contacting the back of the solar cells. The ILD can be applied to the wires and the wire mounting layer or it can be applied to the back of the solar cells before the conductive wires and the wire mounting layer are applied over the back of the solar cell array. Alternatively the ILD may be applied as strips over the wires on the wire mounting layer or as strips over the portions of the back side of the solar cells over which the conductive wires will be positioned. The thickness of the ILD will depend in part on the insulating properties of the material comprising the ILD, but preferred polymeric ILDs have a thickness in the range of 5 to 500 microns, and more preferably 10 to 300 microns and most preferably 25 to 200 microns. Where the conductive wires have a complete insulating coating or sheath, it may be possible to eliminate the ILD between the electrically conductive wires of the integrated back-sheet and the back side of the back-contact solar cells to which the integrated back-sheet is applied.

Figure 5B:
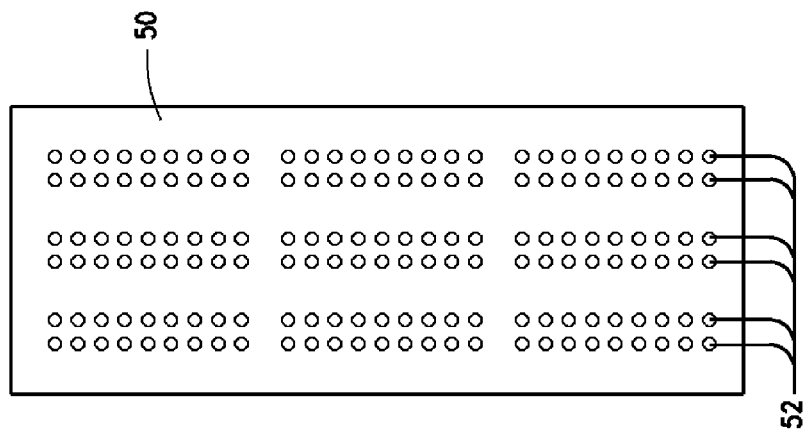
FIG. 5b is a plan view of the ILD in which holes or openings have been formed or cut out.
Figure 5A:
FIG. 5a is a plan view of a an interlayer dielectric (ILD)

An ILD layer is shown in FIG. 5a. The ILD is in the form of a sheet that covers at least one column of solar cells in the solar cell array, and preferably covers multiple columns of solar cells in the solar cell array or more preferably covers all of the columns of solar cells in the solar cell array. The sheet 50 is preferably comprised of an insulating material such as a thermoplastic or thermoset polymer, and is preferably comprised of one or more of the materials that comprise wire mounting layer 38 as described above. For example, the ILD may be an insulating polymer film such as a polyester, polyethylene or polypropylene film. In one embodiment, the ILD is comprised of a PET polymer film that is coated with or laminated to an adhesive or an encapsulant layer such as an EVA film. Preferably the ILD is comprised of a material that can be die cut or punched, or that can be formed with openings in it. The ILD may be coated with an adhesive, such as a pressure sensitive adhesive, on the side of the ILD that will initially be contacted with the conductive wires and wire mounting layer or that will be initially contacted with the back side of the solar cells, depending upon the order of assembly. Suitable adhesive coatings on the ILD include pressure sensitive adhesives, thermoplastic or thermoset adhesives such as the ethylene copolymers discussed above, or acrylic, epoxy, vinyl butryal, polyurethane, or silicone adhesives. As shown in FIG. 5b, openings 52 are formed in the ILD. These openings will correspond to arrangement of the solar cell back contacts when the ILD is positioned between the conductive wires of the integrated back-sheet and the back of the solar cell array. Preferably, the openings are formed by punching or die cutting the ILD, but alternatively the ILD can be formed with the openings.

Figure 6A:
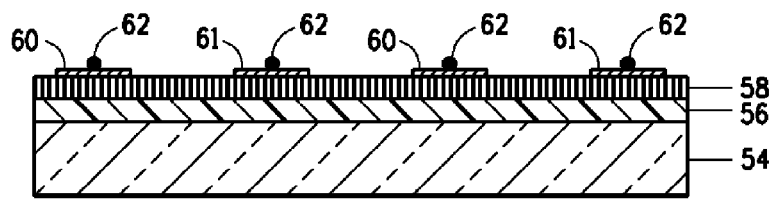
FIGS. 6a-6d are cross-sectional views illustrating one disclosed process for forming a back-contact solar cell module in which integrated conductive wires are connected to the back contacts of solar cells.

FIGS. 6a-6d illustrate in cross section the steps of one process for making a back-contact solar module with an integrated back-sheet. As shown in FIG. 6a, a transparent front sheet 54, made of glass or a polymer such as a durable fluoropolymer, is provided. The transparent front sheet typically has a thickness of from 2 to 4 mm for glass front sheet or 50 to 250 microns for polymer front sheet. A front encapsulant layer 56 may be applied over the front sheet 54. The encapsulant may be comprised of any of the encapsulant or adhesive materials described above with regard to the wire mounting layer 38. The front encapsulant layer typically has a thickness of from 200 to 500 microns. A photoactive solar cells 58, such as a crystalline silicon solar cell, is provided on the encapsulant layer 56. The solar cell has all of its electrical contacts on the back side of the solar cell. The best known types of back-contact solar cells are metal wrap through (MWT), metal wrap around (MWA), emitter wrap through (EWT), emitter wrap around (EWA), and interdigitated back contact (IBC). Electrical conductors on the light receiving front side of the solar cell (facing the transparent front sheet that is not shown) are connected through vias (not shown) in the solar cell to back side conductive pads 60, while a back side conductive layer (not shown) is electrically connected to back side contact pads 61. The back contact pads are typically silver pads fired on the solar cells from a conductive paste of silver particles and glass frit in an organic carrier medium.

A small portion of solder or of a polymeric electrically conductive adhesive is provided on each of the contact pads 60 and 61. The portions of solder or conductive adhesive are shown as balls 62 in FIG. 6a. The solder may be a conventional solder, such as 60/40 tin lead, 60/38/2 tin lead silver, other known solder alloys, or a low melting point solder, such as low melting point solder containing indium that melts around 160° C. The conductive adhesive may be any known conductive adhesive, such as an adhesive comprised of conductive metal particles, such as silver, nickel, conductive metal coated particles or conductive carbon suspended in epoxies, acrylics, vinyl butryals, silicones or polyurathanes. Preferred conductive adhesives are aniostropically conductive or z-axis conductive adhesives that are commonly used for electronic interconnections.

Figure 6B:
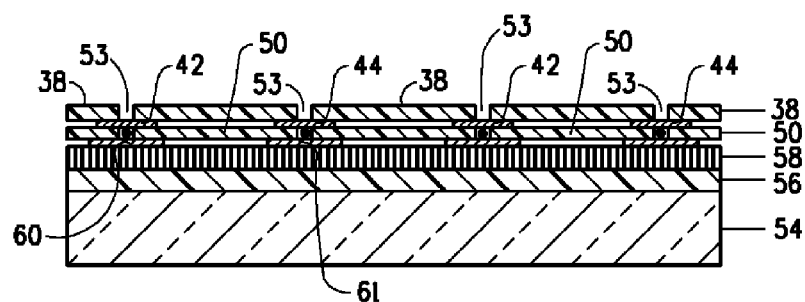
Figure 6C:
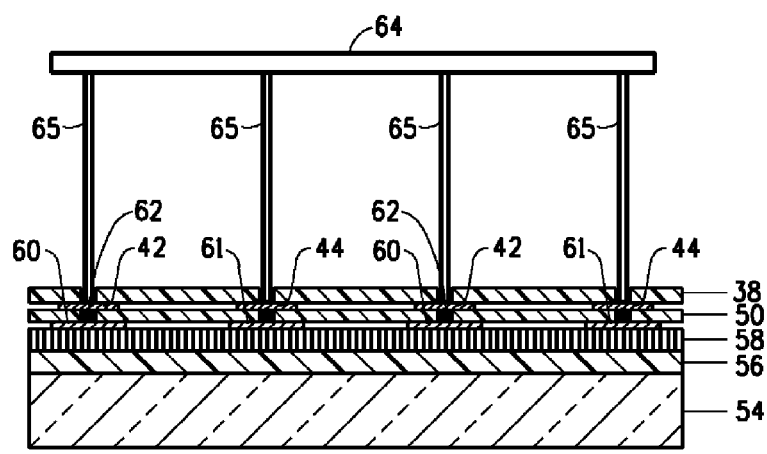

FIG. 6b shows the application of an ILD 50, like the layer shown and described with regard to FIG. 5b, over the back of the solar cell array. FIG. 6b also shows the application of electrically conductive ribbon-shaped wires 42 and 44 over the back contacts 60 and 61 of the solar cell 58. The conductive wires 42 and 44 are provided on the wire mounting layer 38 as described above. The wire mounting layer 38 shown in FIG. 6b has holes 53 in the surface that are formed, cut or punched in the wire mounting layer over the areas where the conductive wires are to be connected to the back contacts of the solar cell. As shown in FIG. 6c, heating pins 65 of a welding apparatus 64 are arranged to be applied to the conductive wires through the holes in the wire mounting layer 38. The heating pins 65 may be in a spring loaded "bed of nails" arrangement so as to be able to contact numerous points on the conductive wires at the same time. The pins 65 heat the portions of the wire over the back contacts and can press the wires into engagement with the balls 62 of solder or adhesive polymer. When the wires are soldered to the back contacts, the pins 65 heat the portions of the wires over the back contacts of the solar cell to a temperature in the range of about 150 to 700° C., and more typically 400 to 600° C. Solders that melt at lower temperatures, such as 160° C., are useful in the disclosed process.

Figure 6D:
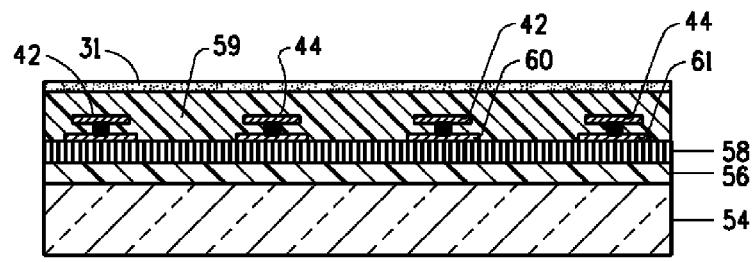

As shown in FIG. 6d, the back-sheet 31 is applied over the wire mounting layer and the entire stack is subjected to heat lamination, as for example in a heated vacuum press. The back-sheet 31 may be a single or multiple layer protective back-sheet, such as the back-sheet with layers 32, 34 and 36 described above with regard to FIGS. 3a and 3b. Where the wire mounting layer 38 and the ILD 50 are both comprised of an encapsulant material such as EVA, the lamination process causes a unified encapsulant layer 59 to be formed between the back of the solar cell 58 and the back-sheet 31, which encapsulant layer envelops the conductive wires 42 and 44.

Figure 7A:
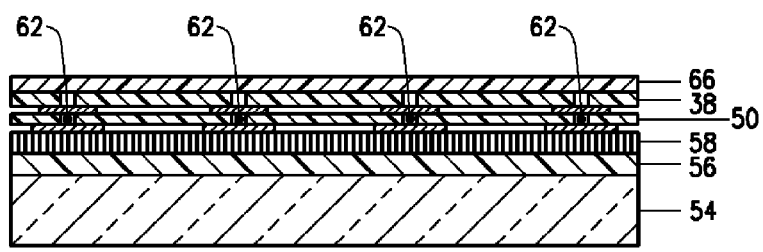
FIGS. 7a and 7b are cross-sectional views illustrating one disclosed process for forming a back-contact solar cell module in which integrated conductive wires are connected to the back contacts of solar cells.
Figure 7B:
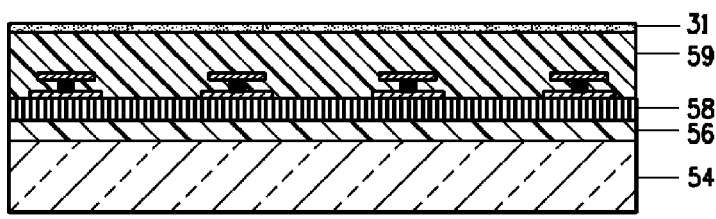

When a conductive adhesive is used to attach and electrically connect the conductive wires to the back contacts of the solar cells, the conductive adhesive may be heated above its softening temperature with the heated pins 65 as described above with regard to soldering. More preferably, the conductive adhesive can be selected to have a softening temperature close to the temperature that must be applied to the wire mounting layer and any additional encapsulant layer so as to melt and cure the encapsulant and cause the adhesive polymer to electrically connect and bond the solar cell back contacts and the conductive wires during the thermal lamination of the solar module. In this alternative embodiment, where the conductive adhesive 62 is softened during lamination, it is not necessary for the wire mounting layer 38 to have holes in it through which heating pins can pass. However, when the conductive wires are not bonded to the solar cell back contact prior to the heated lamination of the solar module, it may be necessary to use other means to hold the conductive wires 42 and 44 in place during lamination of the solar module. This can be accomplished by making the wire mounting layer 38 more rigid by curing the wire mounting layer after the conductive wires are applied to the mounting layer and before the solar module lamination steps. Curing of the wire mounting layer is done by heating the wire mounting layer to a point above it's cross linking temperature in a range of 120 to 160° C. for a specified time of 5 to 60 minutes. As shown in FIG. 7a, an additional layer 66 of an encapsulant or a suitable adhesive can be applied over the cured wire mounting layer 38 before application of the protective back-sheet 31. When the module is laminated to form the module shown in FIG. 7b, a unified back encapsulant 59 can be formed from the ILD 50, the pre-cured wire mounting layer 38 and the additional encapsulant layer 66 shown in FIG. 7a.

Figure 8A:
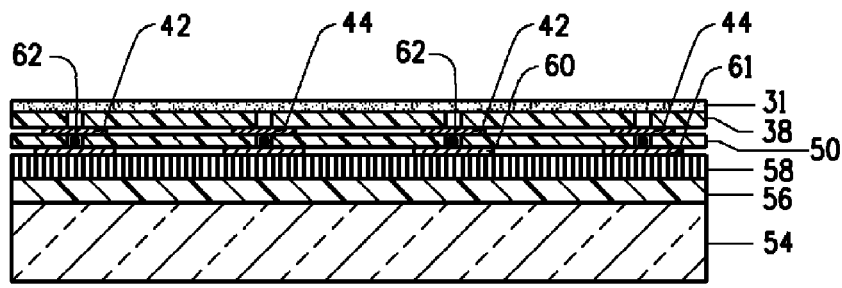
FIGS. 8a and 8b are cross-sectional views illustrating one disclosed process for forming a back-contact solar cell module in which integrated conductive wires are connected to the back contacts of solar cells.
Figure 8B:
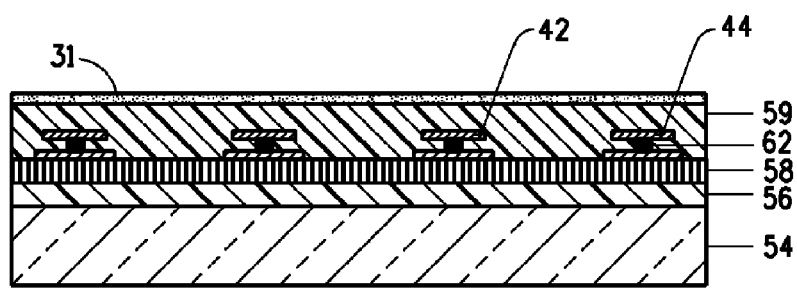

FIGS. 8a and 8b illustrate an alternative process for holding the conductive wires in place over the solar cell back contacts where a conductive adhesive 62 is used to bond and electrically connect the solar cell back contacts and the conductive wires. The conductive adhesive 62 is selected to have a curing temperature that is sufficiently below the melting and curing temperature of the encapsulant such that conductive adhesive can be cured after the conductive wires are applied over the solar cell back contacts but before the solar module is laminated. For example, the conductive adhesive may be selected to have a curing temperature of from room temperature to about 100° C. and so that the conductive adhesive can be melted and cured so as to firmly attach the conductive wires 42 and 44 to the back contacts 60 and 61, respectively, before the overall module is laminated. Subsequently, the module is laminated and cured at a higher temperature of about 100 to 180° C. during which the ILD 50 and the wire mounting layer 38 (as shown in FIG. 8a) are formed into a cured unified back encapsulant layer 59 between the solar cell 58 and the back-sheet 31 (as shown in FIG. 8b). During module lamination, the conductive wires are held in place and in contact with the solar cell back contacts by the pre-cured conductive adhesive.

Figure 9A:
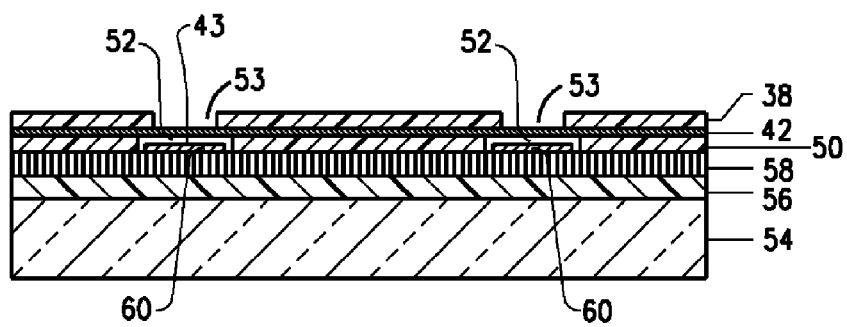
FIGS. 9a-9c are cross-sectional views illustrating one disclosed process for forming a back-contact solar cell module in which integrated conductive wires are connected to the back contacts of solar cells.
Figure 9B:
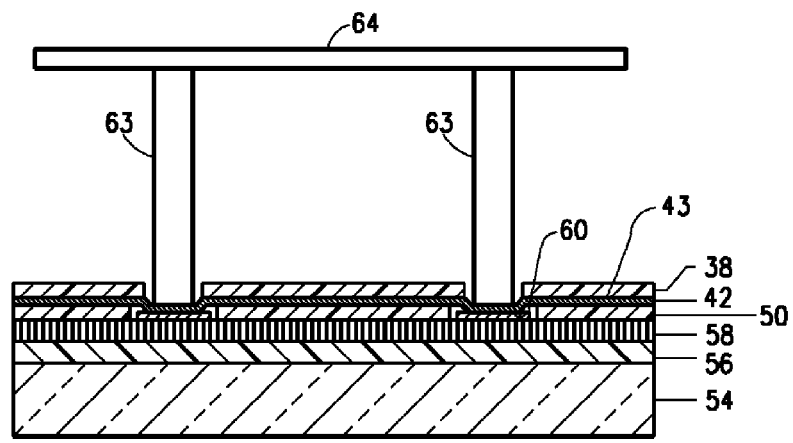
Figure 9C:
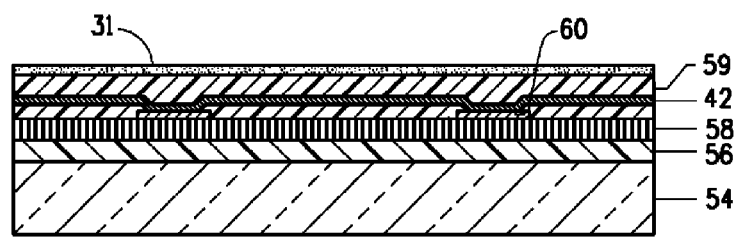

FIGS. 9a-9c illustrate an alternative process for connecting a conductive wire to the back contacts of a solar cell. As shown in FIG. 9a, the conductive wire 42 is coated with solder and/or a flux material 43 as described more fully above. The conductive wire 42 is adhered to the wire mounting layer 38 as described above with openings 53 cut or formed in the wire mounting layer over the areas where the conductive wire is to be connected to the back contacts of a solar cell. The wire 42 shown in FIG. 9a has the solder and/or flux coating applied along its full length, but it is contemplated that the wire could have the coating applied only on the portions of the wire that will be aligned with the back contacts of a solar cell to which the conductive wires are applied. An ILD 50, such as an ILD comprised of a polymeric encapsulant such as EVA, is formed with holes 52 corresponding to the solar cell back contacts and is placed over the back of the solar cell. No solder or conductive adhesive material is applied to the solar cell back contacts. As shown in FIG. 9b, heating fingers 63 of a heating apparatus 64 press and heat the wires so as to solder the conductive wire 42 to the back contacts of the solar cell. After the conductive wires have been soldered to the back contacts of the solar cell, the protective back-sheet 31 is applied on the side of the wire mounting layer 38 opposite the conductive wires, and the overall module is laminated for form the solar cell module shown in FIG. 9c. Where the ILD 50 is comprised of an encapsulant material, a cured encapsulant layer 59 (shown in FIG. 9c) is formed from the ILD 50 and the wire mounting layer 38. The encapsulant layer 59 adheres the protective back-sheet 31 to the back side of the solar cell and envelops the conductive wire. This process could be used to connect all of the conductive wires 42 and 44 to the back contacts of the solar cell.

Figure 10B:
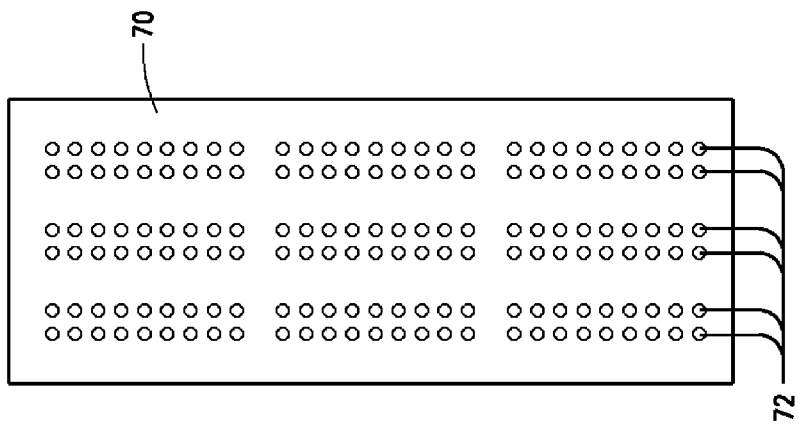
FIG. 10b is a plan view of the wire mounting layer in which holes or openings have been formed or cut out.
Figure 10A:
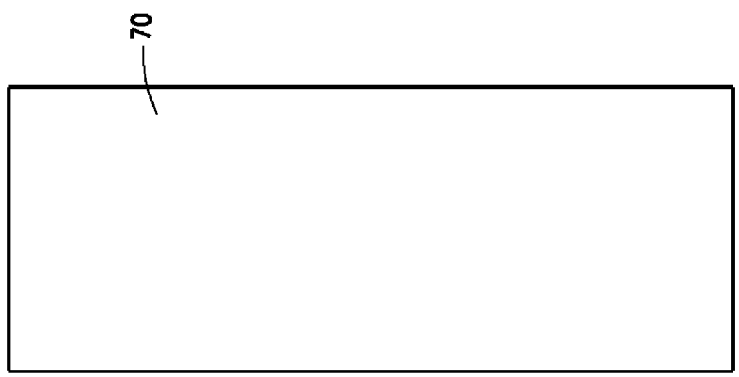
FIG. 10a is a plan view of a polymeric wire mounting layer.

In an alternative embodiment, the ILD can serve as the both the wire mounting layer and as the ILD between the back side of the solar cells and the conductive wires. As shown in FIG. 10a, a wire mounting layer 70 is provided. The wire mounting layer may be comprised of any of the polymeric encapsulant or adhesive materials described above with regard to the wire mounting layer 38 of FIG. 4a. As shown in FIG. 10b, holes 72 are punched, die cut or formed in the layer 70 at places that correspond to where the wire mounting layer will be positioned over the back contacts of a solar cell when the wire mounting layer is placed on the back side of a solar cell. As shown in FIG. 10c, conductive wires 42 and 44 are adhered to the wire mounting layer over columns of the holes 72. The conductive wires are adhered to or embedded in the surface of the wire mounting layer as described above. Where the conductive wires will be used to connect solar cells in parallel, the continuous conductive wires are used as shown in FIG. 10c. Where the solar cells are to be connected in series, the conductive wires are selectively cut. Cutting the wires can be performed by a variety of methods including mechanical die cutting, rotary die cutting, mechanical drilling, or laser ablation.

In one embodiment, the wire mounting layer 70 is bonded to a protective back-sheet such as the laminate back-sheet shown in FIG. 3a that is formed from the layers 32, 34 and 36. Where the back-sheet has an external fluoropolymer layer and an internal polyester layer, the wire mounting layer 70 is adhered to the polyester layer with the conductive wires 42 and 44 sandwiched between the polyester layer and the wire mounting layer.

Figure 10D:
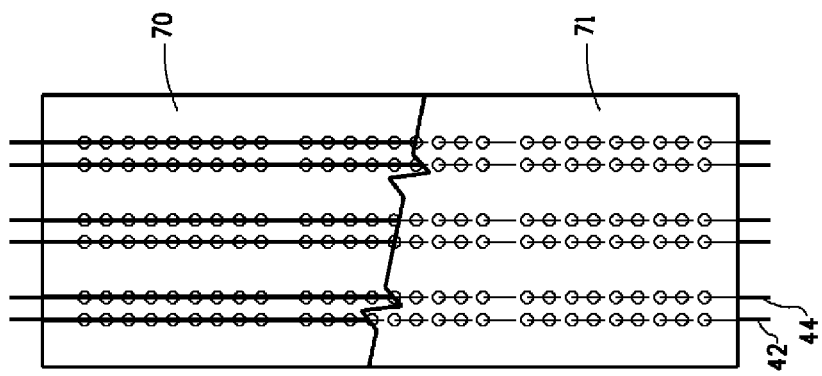
FIG. 10d illustrates the application of a polymeric layer over the conductive wires.
Figure 10C:
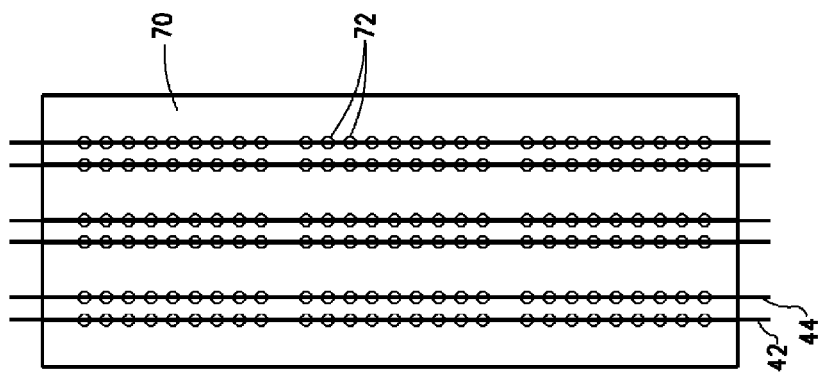
FIG. 10c illustrates the application of conductive wires to the wire mounting layer.

In an alternative embodiment shown in FIG. 10d, an additional wire cover layer 71, comprised of the same or a similar material as used in the wire mounting layer 70, is applied over the conductive wires and the wire mounting layer 70. The wire mounting layer 70, the conductive wires 42 and 44, and the wire cover layer 71 can be fed into a heat press or a nip formed between heated rollers in order to produce the wire containing back-sheet substructure shown in FIG. 10d. This substructure may be utilized in several ways in the production of back-contact solar cell modules. The substructure of FIG. 10d can be adhered to a protective back-sheet by thermal or adhesive lamination wherein the exposed surface of the wire cover layer 71 is adhered to an internal surface of the protective back-sheet such as the polyester layer 36 described with regard to the back-sheet of FIG. 3a. This integrated back-sheet can subsequently be laminated to the back side of a solar cell where the wire mounting layer 70 will adhere directly or indirectly to the back side of the solar cells in a manner such that the holes or openings 72 are positioned over the back contacts of the solar cell. A conductive adhesive can be applied in each of the holes or openings 72 before the wire mounting layer is positioned on the back side of the solar cells such that the conductive adhesive will bond and electrically connect the back contacts of the solar cell to the conductive wires during module lamination. Alternatively, the substructure shown in FIG. 10d, with conductive adhesive applied in the holes or openings 72, can be applied to the back side of a solar cell array with the conductive adhesive in the holes of the wire mounting layer 70 contacting the back contacts on the back side of the solar cells. A protective back-sheet, such as the fluoropolymer/polyester laminate described with regard to FIG. 3a, can then be adhered to the wire cover layer 71 by thermal or adhesive lamination.

Figure 11A:
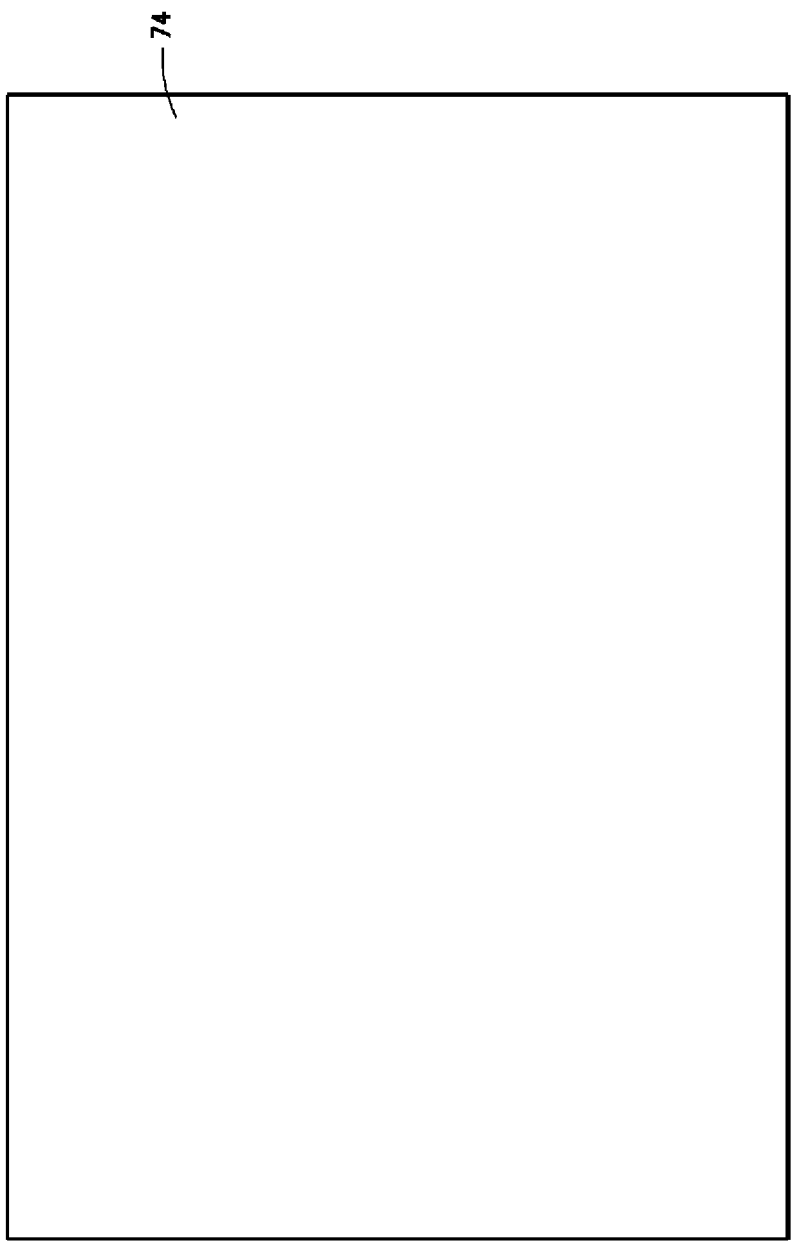
Figure 11B:
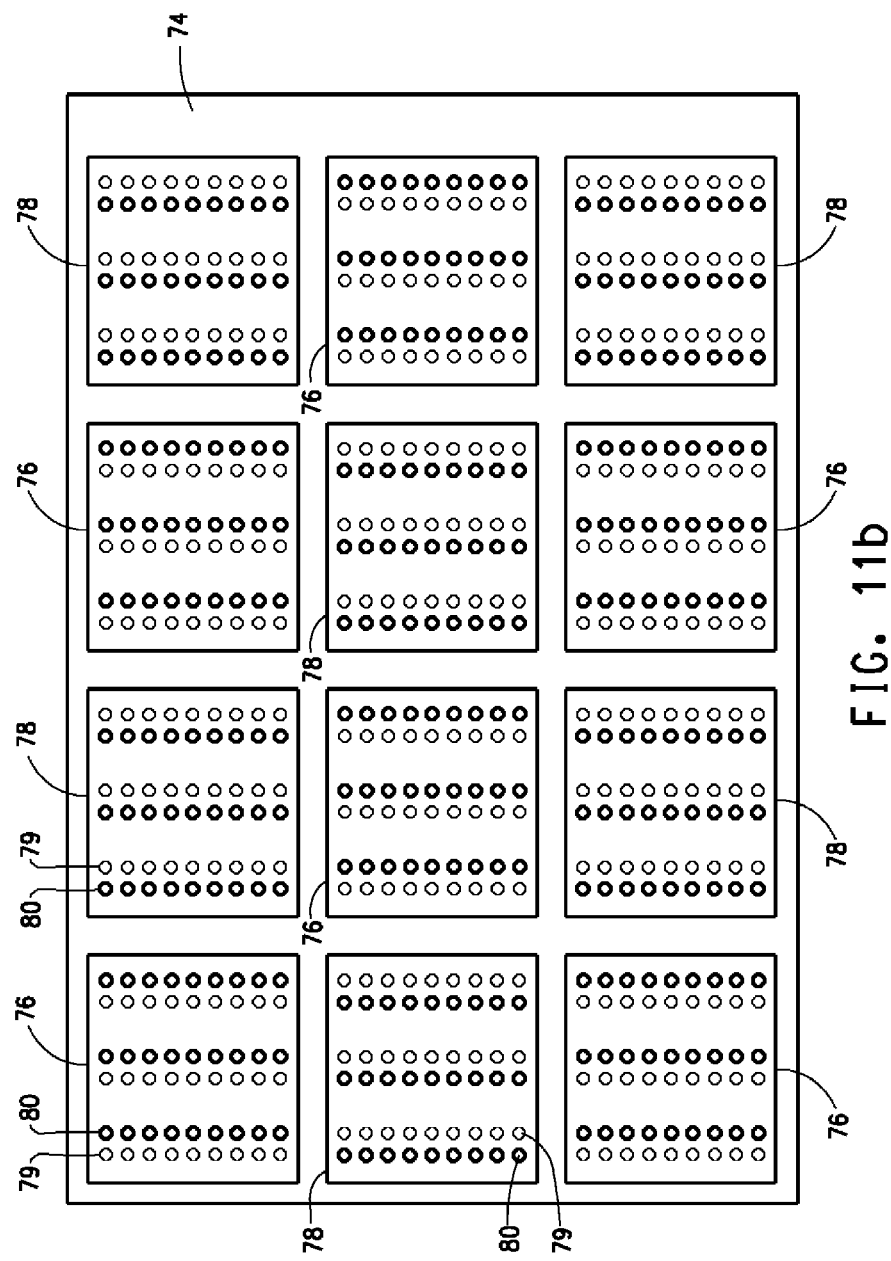

A process for forming a back contact solar cell module with a solar cells connected in series by an integrated back-sheet is shown in FIGS. 11a-11f. According to this process, a front encapsulant layer 74 is provided as shown in FIG. 11a. The front encapsulant layer may be comprised of one of the encapsulant or adhesive sheet materials described above with regard to the wiring mounting layer 38 of FIG. 4. The front encapsulant layer may be an independent self supporting sheet that can be adhered on its front side to a transparent front sheet (not shown) such as a glass or polymer front sheet, or it may be a sheet, coating or layer already adhered on a transparent front sheet. As shown in FIG. 11b, an array of back contact solar cells 76 and 78 are placed on the surface of the encapsulant layer 74 opposite to the front sheet side of the encapsulant layer. The solar cells 76 and 78 are placed with their front light receiving sides facing against the front encapsulant layer 74. Each of the solar cells has columns of positive and negative polarity back contacts with the negative contacts represented by the lighter circles 79 and the positive contacts represented by darker circles 80 in FIG. 11b. In the cells 76, in each pair of back contacts, a positive contact 80 is to the right of a negative contact 79. The cells 78 are rotated 180 degrees such that in each pair of back contacts, a negative contact 79 is to the right of one of the positive contacts 80. The cells 76 alternate with the cells 78 in both the vertical and horizontal directions of the solar cell array. It is contemplated that in other embodiments, there could be more of the positive or more of the negative contacts on the solar cells, or that there could be more or fewer columns of either the positive or negative back contacts. While FIG. 11b shows a cell 76 in the upper left hand corner of the solar cell array, it is contemplated that the cells could be arranged with a cell 78 in the upper left hand corner and with a cells 76 arranged below and next to the upper left hand corner cell 78. While the solar cell placements 76 and 78 are shown as alternating in both the vertical and horizontal directions of the array, it is also contemplated that in an array of series connected solar cells, the cell placements 76 and 78 could be alternated only in the vertical direction.

Figure 11C:
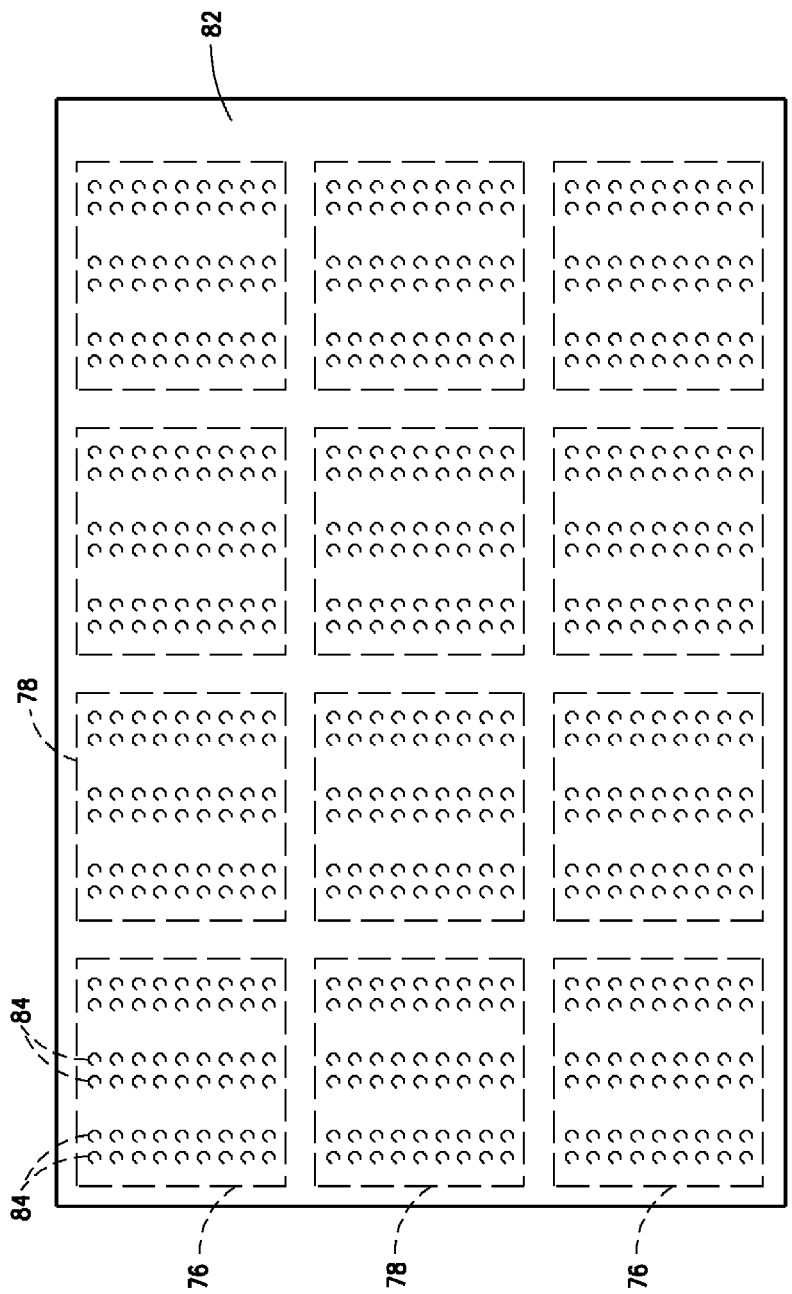
Figure 11D:
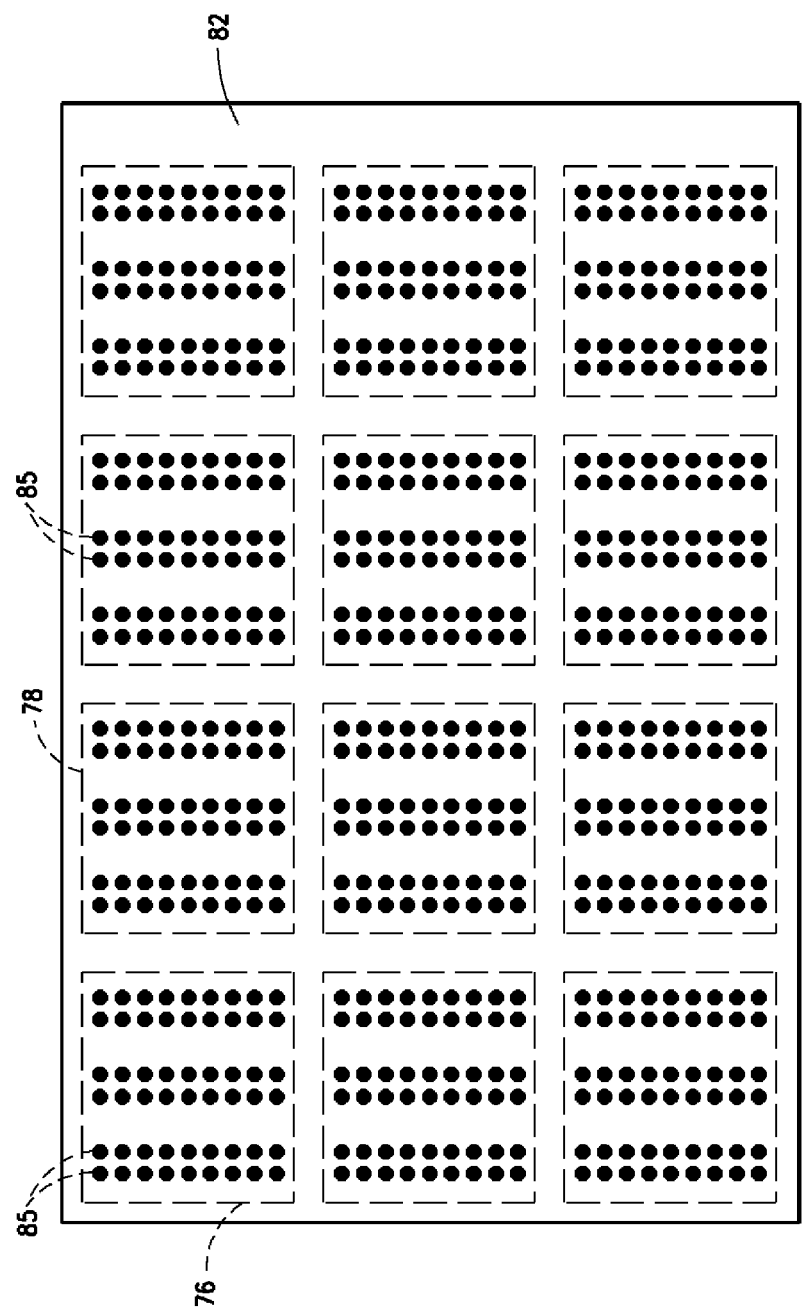

In FIG. 11c, an ILD 82 is placed over the back of the solar cell array. The ILD may be comprised of any of the materials described above with regard to the ILD 50 shown in FIG. 6b. The ILD 82 preferably has a thickness of about 1 to 10 mils. Holes 84 are preformed, pre-cut or punched in the ILD 82 over where the back contacts of the solar cell array will be located. In FIG. 11d, the holes or openings in the ILD 82 are shown filled with a conductive adhesive dabs 85 which may be screen printed in the holes 84 of the ILD 82, or alternatively may be applied by syringe or other application method.

In FIG. 11e, one or more wire mounting layer strips 86 with longitudinally extending wires 42 and 44, like the wire substructure shown and described with regard to FIG. 4b, are provided and applied over the dielectric interlayer 82. The wires 42 and 44 are provided over sets of positive and negative back contacts on the solar cells. The side of the wire mounting layer strips 86 on which the wires are exposed is positioned so that the conductive wires 42 and 44 contact the conductive adhesive dabs 85 in the holes of the ILD 82. In one embodiment, the side of the wire mounting layer strips opposite the side on which the wires are mounted is already adhered to a protective back-sheet or to back-sheet laminate layers like the layers 32, 34 and 36 as shown and described with regard to FIGS. 3a and 3b. It is contemplated that all of the conductive wires 42 and 44 required for a module could be adhered to a single wire mounting layer strip that covers the entire solar cell array of a solar module.

As shown in FIGS. 11e and 11f, one of the wires 42 and 44 have been selectively cut between each set of solar cells in a column of solar cells in the solar cell array. The wires may be cut, for example, by mechanical die cutting, rotary die cutting, mechanical drilling, or laser ablation. Cutting of the wires may also be performed by punching a hole through both the wire and the wire mounting layer, which hole will be filled during module lamination by polymer flowing from the wire mounting layer or from the encapsulant or adhesive layer between the wire mounting layer and the back-sheet. As shown in FIG. 11e, the wires 42 are positioned over columns of the solar cell back-contacts 79 of negative polarity that can be seen in FIG. 11b, and the wires 44 are positioned over the columns of back-contacts 80 of positive polarity of the solar cell 76 shown in FIG. 11b in the upper left corner of the solar cell array. The wires 42 are cut between where the wires 42 contact the solar cell 76 and where they contact the solar cell 78 which has been rotated 180 degrees and that is positioned below the cell 76. The wires 44 which are positioned over the positive polarity contacts on the upper left solar cell 76 runs continuously over the negative contacts on the solar cell 78 positioned below the upper left solar cell 76 so as to connect the positive polarity contacts of the one cell in series to the negative polarity contacts of the next cell. The wires 44 are cut between where the wires 44 are positioned over the cell 78 and where they are positioned over the next cell 76 at the bottom right side of the solar cell array that can be seen in FIG. 11b. On the other hand, the wires 42 that are positioned over the positive contacts of the middle cell in the left hand column of the solar cell array run continuously to where the wires 42 are positioned over the negative contacts of the solar cell 76 at the bottom right side of the solar cell array as can be seen in FIG. 11b. This pattern is repeated for as many solar cells as there are in the columns of the solar cell array. In FIG. 11e, the wires 42 and 44 are shown as being attached to four wire mounting layer strips 86, but it is contemplated that the wires could all be mounted, and optionally precut, on just one or two wire mounting layer strips that cover the entire solar cell array.

FIG. 11f shows the application of bus connections 94, 96, and 98 on the ends of the solar module. The terminal buss 94 connects to the wires 44 that are over and will connect to the positive back-contacts on the solar cell at the bottom left hand side of the solar cell array. Likewise, the terminal buss 98 connects to the wires 44 that are over the negative back-contacts on the solar cell at the bottom right hand side of the solar cell array. Positive terminal buss 94 is connected to a positive lead 93 and the negative terminal buss 98 is connected to a negative lead 97. The intermediate buss connectors 96 connect the positive or negative back contacts at the top or bottom of one column of solar cells to the oppositely charged contacts at the same end of the adjoining column of solar cells. The terminal buss connections may alternately be extended through the "Z" direction out through the back-sheet. This would eliminate the need for extra space at the ends of the module for running the buss wires to a junction box. Such "extra space" would reduce the packing density of the cells and reduce the electric power output per unit area of the module.

The solar cell array shown in FIG. 11 is simplified for purpose of illustration and shows only four columns of three solar cells, and each solar cell is shown with just three columns of positive and three columns of negative back contacts. It is contemplated that the solar cell array of the solar module could have many more columns or rows of individual solar cells, and that each solar cell could have fewer or more columns or rows of back contacts than what is shown in FIG. 11.

The photovoltaic module of FIG. 11 may be produced through autoclave and non-autoclave processes. For example, the photovoltaic module constructs described above may be laid up in a vacuum lamination press and laminated together under vacuum with heat and standard atmospheric or elevated pressure. In an exemplary process, a glass sheet, a front-sheet encapsulant layer, a back-contact photovoltaic cell layer, a layer of longitudinally extending wires in a back-sheet encapsulant layer, and a back-sheet as disclosed above are laminated together under heat and pressure and a vacuum (for example, in the range of about 27-28 inches (689-711 mm) Hg) to remove air. In an exemplary procedure, the laminate assembly is placed into a bag capable of sustaining a vacuum ("a vacuum bag"), drawing the air out of the bag using a vacuum line or other means of pulling a vacuum on the bag, sealing the bag while maintaining the vacuum, placing the sealed bag in an autoclave at a temperature of about 120° C. to about 180° C., at a pressure of from 50 to 250 psig, and preferably about 200 psi (about 14.3 bars), for from about 10 to about 50 minutes. Preferably the bag is autoclaved at a temperature of from about 120° C. to about 160° C. for 20 minutes to about 45 minutes. More preferably the bag is autoclaved at a temperature of from about 135° C. to about 160° C. for about 20 minutes to about 40 minutes.

Air trapped within the laminate assembly may be removed using a nip roll process. For example, the laminate assembly may be heated in an oven at a temperature of about 80° C. to about 120° C., or preferably, at a temperature of between about 90° C. and about 100° C., for about 30 minutes. Thereafter, the heated laminate assembly is passed through a set of nip rolls so that the air in the void spaces between the photovoltaic module outside layers, the photovoltaic cell layer and the encapsulant layers may be squeezed out, and the edge of the assembly sealed. This process may provide a final photovoltaic module laminate or may provide what is referred to as a pre-press assembly, depending on the materials of construction and the exact conditions utilized.

The pre-press assembly may then be placed in an air autoclave where the temperature is raised to about 120° C. to about 160° C., or preferably, between about 135° C. and about 160° C., and the pressure is raised to between about 50 psig and about 300 psig, or preferably, about 200 psig (14.3 bar). These conditions are maintained for about 15 minutes to about 1 hour, or preferably, about 20 to about 50 minutes, after which, the air is cooled while no more air is added to the autoclave. After about 20 minutes of cooling, the excess air pressure is vented and the photovoltaic module laminates are removed from the autoclave. The described process should not be considered limiting. Essentially, any lamination process known within the art may be used to produce the back contact photovoltaic modules with integrated back circuitry as disclosed herein.

If desired, the edges of the photovoltaic module may be sealed to reduce moisture and air intrusion by any means known within the art. Such moisture and air intrusion may degrade the efficiency and lifetime of the photovoltaic module. Edge seal materials include, but are not limited to, butyl rubber, polysulfide, silicone, polyurethane, polypropylene elastomers, polystyrene elastomers, block elastomers, styrene-ethylene-butylene-styrene (SEBS), and the like.

While the presently disclosed invention has been illustrated and described with reference to preferred embodiments thereof, it will be appreciated by those skilled in the art that various changes and modifications can be made without departing from the scope of the present invention as defined in the appended claims.

What is claimed is:

1. A process for making a back-contact solar cell module, comprising:

providing a solar cell array of at least four solar cells each having a front light receiving surface, an active layer that generates an electric current when said front light receiving surface is exposed to light, and a rear surface opposite said front surface, said rear surface having positive and negative polarity electrical contacts thereon, at least two of the solar cells of the solar cell array arranged in a column;

providing a polymeric interlayer dielectric layer having opposite first and second sides and having a lengthwise length and direction and a crosswise direction perpendicular to the lengthwise direction, forming openings in said polymeric interlayer dielectric layer said openings being arranged in a plurality of columns extending in the lengthwise direction of said polymeric interlayer dielectric layer, and placing said the first side of said polymeric interlayer dielectric layer on the rear surfaces of the solar cells of the solar cell array, wherein the holes in the polymeric interlayer dielectric layer are aligned over electrical contacts on the rear surface of the solar cells;

providing a polymeric wire mounting layer having opposite first and second sides and having a lengthwise direction and a crosswise direction perpendicular to the lengthwise direction;

providing a plurality of elongated electrically conductive wires and adhering said plurality of electrically conductive wires to the first side of said polymeric wire mounting layer in the lengthwise direction of said polymeric wire mounting layer, said electrically conductive wires being substantially aligned with the lengthwise direction of said polymeric wire mounting layer, said plurality of electrically conductive wires each having a cross sectional area of at least 70 square mils along their length, said plurality of electrically conductive wires not touching each other upon being adhered to said polymeric wire mounting layer, and said plurality of electrically conductive wires extending at least the length of a column of the solar cells in the solar cell array;

placing the first side of the wire mounting layer on the polymeric interlayer dielectric layer wherein the conductive wires on the first side of the wire mounting layer are over the openings in one of the plurality of columns of openings in said polymeric interlayer dielectric layer;

providing an electrically conductive binder in the holes of the polymeric interlayer dielectric layer, and heating the electrically conductive binder in the holes of the interlayer dielectric layer such that the binder physically and electrically attaches the electrically conductive wires to the positive and negative electrical contacts on said solar cells through the openings in said polymeric interlayer dielectric layer;

providing a polymeric back-sheet over the second side of said polymeric wire mounting layer;

thermally laminating said polymeric back-sheet, said polymeric wire mounting layer, said polymeric interlayer dielectric layer, and said solar cell array after the conductive wires have been physically and electrically attached to the positive and negative electrical contacts on the rear surface of the solar cells by the binder.

2. The process for making a back-contact solar cell module of claim 1, further comprising the steps of:

providing a plurality of openings in said polymeric wire mounting layer arranged in a plurality of columns extending in the lengthwise direction of said polymeric wire mounting layer, wherein each column of openings in said polymeric wire mounting layer is aligned with an electrically conductive wire adhered to the polymeric wire mounting layer and wherein the openings in the polymeric wire mounting layer are aligned with the holes in the polymeric interlayer dielectric layer when the polymeric wire mounting layer is placed on the polymeric interlayer dielectric layer;

inserting heating pins into the openings in said polymeric wire mounting layer and contacting the heated pins with the conductive wires so as to locally heat the wires and the electrically conductive binder such that the binder physically and electrically attaches the conductive wires to the positive and negative electrical contacts on said solar cells through the openings in said polymeric interlayer dielectric layer; and removing the heating pins from the openings in said polymeric wire mounting layer before said second side of said polymeric wire mounting layer is attached to said back-sheet.

3. The process for making a back-contact solar cell module of claim 2 wherein the binder is solder.

4. The process for making a back-contact solar cell module of claim 3 wherein the solder is selected from the group of tin, nickel, tin/lead alloy, tin/lead/silver alloy, tin/copper alloy, tin/silver alloy, tin/bismuth alloy or combinations thereof.

5. The process for making a back-contact solar cell module of claim 3 wherein the solder is a low melting point solder that melts at a temperature in the range of 160 to 220° C.

6. The process of claim 3 wherein solder is inserted into the holes of the interlayer dielectric layer before the wire mounting layer is placed on the interlayer dielectric layer.

7. The process for making a back-contact solar cell module of claim 3 wherein the solder is coated on the electrically conductive wires, and the heating pins press the conductive wires coated with solder into contact with the positive and negative electrical contacts on said solar cells and solder the wires to with the positive and negative electrical contacts on said solar cells.

8. The process for making a back-contact solar cell module of claim 2 wherein the binder is a conductive adhesive.

9. The process for making a back-contact solar cell module of claim 8 wherein the conductive adhesive is a thermoplastic polymer filled with conductive metal particles.

10. The process for making a back-contact solar cell module of claim 1 wherein the binder is a conductive adhesive with a curing temperature in the range of 70 to 150° C., and said conductive adhesive is cured so as to physically and electrically attach the conductive wires to the positive and negative electrical contacts on said solar cells through the openings in said polymeric interlayer dielectric layer before the step of thermally laminating said polymeric back-sheet, said polymeric wire mounting layer, said polymeric interlayer dielectric layer, and said solar cell array.

11. The process for making a back-contact solar cell module of claim 10 wherein the conductive adhesive is comprised of conductive metal particles suspended in epoxy, acrylic, vinyl butryal, silicone, polyurethane, or a combination thereof.

12. The process for making a back-contact solar cell module of claim 1 wherein said polymeric wire mounting layer and said polymeric interlayer dielectric layer are comprised of a polymer encapsulant material selected from poly(vinyl butyral), ionomers, ethylene vinyl acetate, poly(vinyl acetal), polyurethane, poly(vinyl chloride), polyolefins, polyolefin block elastomers, ethylene acrylate ester copolymers, ethylene copolymers, silicone elastomers, chlorosulfonated polyethylene, and combinations thereof.

13. The process for making a back-contact solar cell module of claim 12 wherein said polymeric wire mounting and said interlayer dielectric layer are made of an ethylene copolymer comprised of ethylene and one or more monomers selected from the group consisting of C1-4 alkyl acrylates, C1-4 alkyl methacrylates, methacrylic acid, acrylic acid, glycidyl methacrylate, maleic anhydride and copolymerized units of ethylene and a comonomer selected from the group consisting of C4-C8 unsaturated anhydrides, monoesters of C4-C8 unsaturated acids having at least two carboxylic acid groups, diesters of C4-C8 unsaturated acids having at least two carboxylic acid groups and mixtures of such copolymers, wherein the ethylene content in the ethylene copolymer accounts for 60-90% by weight.

14. The process for making a back-contact solar cell module of claim 1 wherein said polymeric back-sheet comprises a polyester layer comprised of polymer from a group consisting of polyethylene terephthalate, polytrimethylene terephthalate, polybutylene terephthalate, polyhexamethylene terephthalate, polyethylene phthalate, polytrimethylene phthalate, polybutylene phthalate, polyhexamethylene phthalate or a copolymer or blend of two or more of the above.

15. The process for making a back-contact solar cell module of claim 1 wherein said polymeric back-sheet comprises a fluoropolymer layer comprised of polymer from a group consisting of polyvinylfluoride, polyvinylidene fluoride, polytetrafluoroethylene, ethylene-tetrafluoroethylene and combinations thereof.

16. The process for making a back-contact solar cell module of claim 1 wherein said polymeric back-sheet comprises a polyester layer with opposite first and second sides, a first fluoropolymer layer adhered to the first side of said polyester layer, and a second fluoropolymer layer adhered to the second side of said polyester layer, and wherein the second side of said wire mounting layer is adhered to said second fluoropolymer layer of said back sheet in the lengthwise direction of the wire mounting layer.

17. The process for making a back-contact solar cell module of claim 1 further comprising the step of selectively cutting one or more of said electrically conductive wires at one or more selected points along the length of said electrically conductive wires.

18. The process for making a back-contact solar cell module of claim 1 wherein the electrically conductive wires are comprised of metal selected from copper, nickel, tin, silver, aluminum, and combination thereof.

19. The process for making a back-contact solar cell module of claim 18 wherein the electrically conductive wires are metal wires coated with tin, nickel, tin/lead alloy, tin/lead/silver alloy, tin/copper alloy, tin/silver alloy, tin/bismuth alloy or combinations thereof.

20. The process for making a back-contact solar cell module of claim 1 wherein the electrically conductive wires are ribbon-shaped metal wires having a width and thickness wherein the wire width is at least three times greater than the wire thickness.

* * * * *